(12) United States Patent
Imai et al.

(10) Patent No.: US 7,271,401 B2
(45) Date of Patent: Sep. 18, 2007

(54) EXTREME ULTRA VIOLET LIGHT SOURCE DEVICE

(75) Inventors: Yousuke Imai, Hiratsuka (JP); Hideo Hoshino, Hiratsuka (JP); Hiroshi Komori, Hiratsuka (JP)

(73) Assignees: Komatsu Ltd., Tokyo (JP); Gigaphoton Inc., Tokyo (JP)

( * ) Notice: Subject to any disclaimer, the term of this patent is extended or adjusted under 35 U.S.C. 154(b) by 61 days.

(21) Appl. No.: 11/214,819

(22) Filed: Aug. 31, 2005

(65) Prior Publication Data

US 2006/0186356 A1 Aug. 24, 2006

(30) Foreign Application Priority Data

Sep. 9, 2004 (JP) ............................. 2004-261871

(51) Int. Cl.
*G01J 3/10* (2006.01)
(52) U.S. Cl. ............................. 250/504 R; 250/493.1; 250/423 R; 378/119
(58) Field of Classification Search ..................... None
See application file for complete search history.

(56) References Cited

U.S. PATENT DOCUMENTS 4,886,969 A * 12/1989 Knauer ....................... 250/427

7,087,914 B2 * 8/2006 Akins et al. ............. 250/504 R
7,164,144 B2 * 1/2007 Partlo et al. ............. 250/504 R

FOREIGN PATENT DOCUMENTS

JP 2552433 8/1996
JP 3433151 5/2003

* cited by examiner

*Primary Examiner*—Jack I. Berman
*Assistant Examiner*—Zia R. Hashmi
(74) *Attorney, Agent, or Firm*—Wenderoth, Lind & Ponack, L.L.P.

(57) ABSTRACT

An EUV light source device for protecting a collection mirror from debris that is considered harmful to a mirror coating. The EUV light source device includes: a chamber in which extreme ultra violet light is generated; a target injection unit and a target injection nozzle that supply the chamber with a material to become the target; a laser light source that applies a laser beam to the target so as to generate plasma; a collection mirror that collects the extreme ultra violet light emitted from the plasma; an X-ray source that ionizes neutral particles included in particles emitted from the plasma into charged particles; and plural magnets that generate a magnetic field within the chamber so as to trap at least the charged particles ionized by the X-ray source.

12 Claims, 22 Drawing Sheets

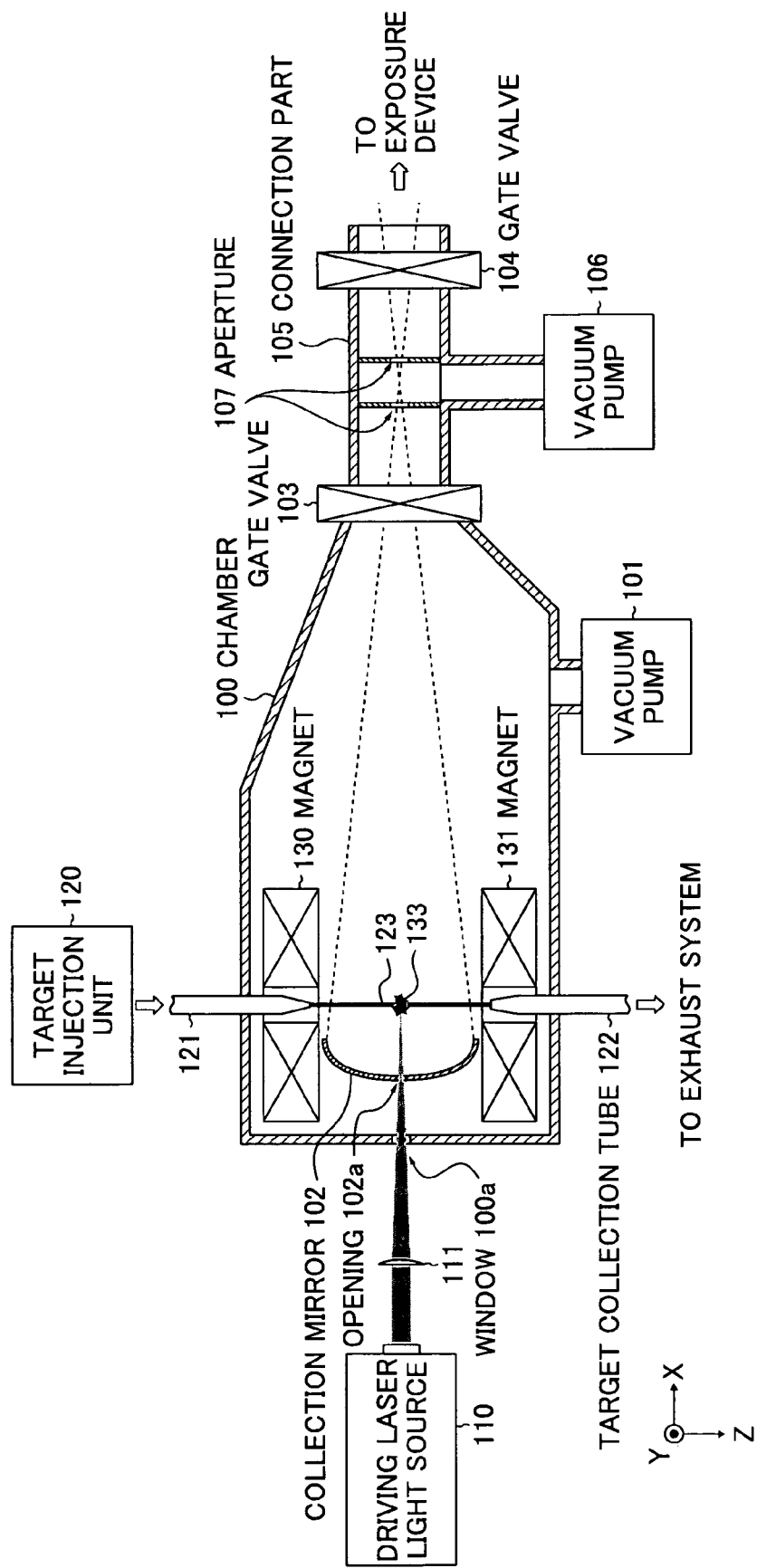

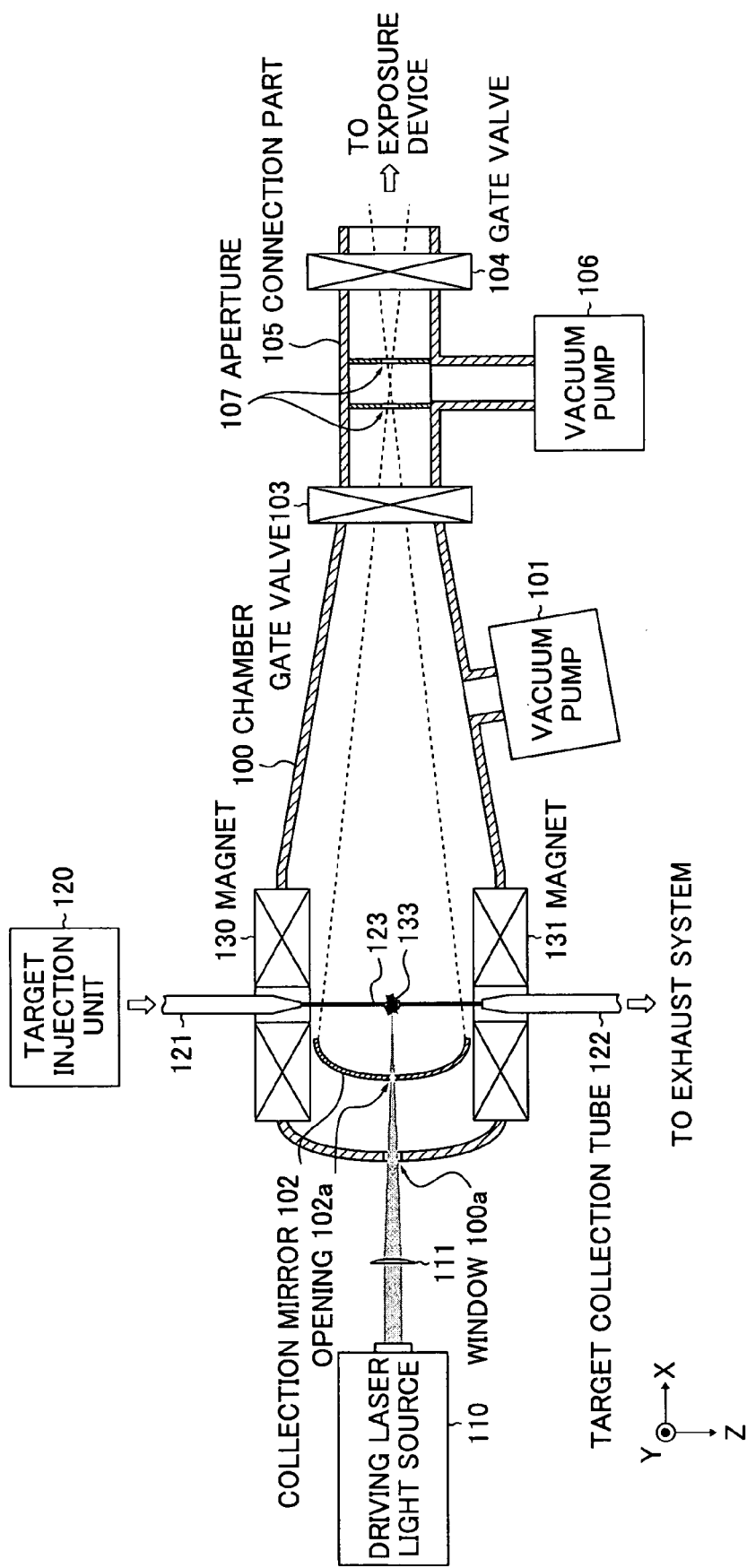

EXTREME ULTRA VIOLET LIGHT SOURCE DEVICE

BACKGROUND OF THE INVENTION

1. Field of the Invention

The present invention relates to a light source device for generating extreme ultra violet (EUV) light by applying a laser beam to a target.

2. Description of Related Art

As semiconductor processes become finer, the photolithography has been making rapid progress to finer fabrication, and, in the next generation, microfabrication of a pattern having a width of 100 nm to 70 nm, further, microfabrication of a pattern having a width of 50 nm or less will be required. For example, in order to fulfill the requirement for microfabrication of a pattern having a width of 50 nm or less, the development of exposure equipment with a combination of an EUV light source for generating light having a wavelength of about 13 nm and a reduced projection cataoptric system is expected.

As the EUV light source, there are three kinds of an LPP (laser produced plasma) light source using plasma generated by applying a laser beam to a target, a DPP (discharge produced plasma) light source using plasma generated by discharge, an SR (synchrotron radiation) light source using orbital radiation. Among them, the LPP light source has advantages that extremely high intensity near black body radiation can be obtained because plasma density can be considerably increased, light emission of only the necessary waveband can be performed by selecting the target material, and an extremely large collection solid angle of $2\pi$ sterad can be ensured because it is a point source having substantially isotropic angle distribution and there is no structure such as electrodes surrounding the light source. Therefore, the LPP light source is thought to be predominant as a light source for EUV lithography in which power of several tens of watts are required.

In the LPP light source, in the case where a solid material is used as a target to which a laser beam is applied for generating plasma, the heat generated by application of the laser beam is conducted to the periphery of the laser beam applied region when the laser beam application region turns into a plasma state, and the solid material is melted on the periphery thereof. The melted solid material becomes debris having a diameter of several micrometers or more, which is emitted in large quantity and causes damage to the collection mirror (specifically, to the mirror coating) and reduces the reflectance thereof. Also, in the case where a liquid material is used as the target, the flying debris causes damage to the collection mirror. On the other hand, in the case where a gas is used as the target, although debris is reduced, the conversion efficiency from the power supplied to the driving laser to the power of the EUV light is reduced.

As a related technology, Japanese Patent Publication JP-B-3433151 discloses a laser plasma X-ray source in which damage to an optical mirror due to the generated debris is prevented and the collection efficiency of X-ray is improved. According to the document, the X-ray source includes a magnetic field applying device for applying a magnetic field in a direction perpendicular to an injection direction of a target. Assuming that the traveling direction of the debris before deflected by the magnetic field is the injection direction of the target, the damage to the optical mirror can be pretended by locating the optical mirror in a direction in which ionic state debris deflected by the magnetic field do not fly.

Further, Japanese Patent Publication JP-B-2552433 discloses a removing method and device capable of radically removing debris generated from a solid target in a relative simple manner. According to the document, electric charges are provided by ultraviolet light to neutral fine particles produced with X-rays from plasma on the surface of a target material, an electromagnetic field in which an electric field and a magnetic field are mutually perpendicular is generated by a pair of mesh-form electrodes arranged along the path of X-ray and an electromagnetic disposed between the pair of electrodes, and the charged fine particles are passed through the electromagnetic field such that the orbit of the charged fine particles can be bent and eliminated to the outside of the X-ray path. Thereby, an X-ray optical element provided in the X-ray path can be protected.

SUMMARY OF THE INVENTION

The present invention has been achieved in view of the above-mentioned problems. An object of the present invention is to provide an extreme ultra violet light source device capable of extending the life of a collection mirror and reducing running cost by protecting the collection mirror from debris that is considered harmful to a mirror coating.

In order to achieve the above object, an extreme ultra violet light source device according to one aspect of the present invention is a device for generating extreme ultra violet light by irradiating a laser beam to a target, and the device includes: a chamber in which extreme ultra violet light is generated, a target supplier that supplies the chamber with a material to become the target; a laser light source that irradiates a laser beam to the target so as to generate plasma; a collection optical system that collects the extreme ultra violet light emitted from the plasma; an ionizer that ionizes neutral particles included in particles emitted from the plasma into charged particles; and a magnetic field generator that generates a magnetic field within the chamber so as to trap at least the charged particles ionized by the ionizer.

According to the present invention, the neutral particles included in debris are ionized by the ionizer, and therefore, not only the charged particles included in the debris but also the neutral particles can be trapped by the magnetic field formed within the chamber. Accordingly, the debris can be efficiently collected and the collection mirror can be protected from the debris that is considered harmful to a mirror coating. As a result, the life of the collection mirror can be extended and the running cost of the EUV light source device can be reduced.

BRIEF DESCRIPTION OF THE DRAWINGS

FIG. 7 shows an example in which the magnets are provided inside of a chamber;

FIG. 8 shows an example in which part of the chamber wall is formed by the magnets;

DETAILED DESCRIPTION OF THE PREFERRED EMBODIMENTS

Figure 1:
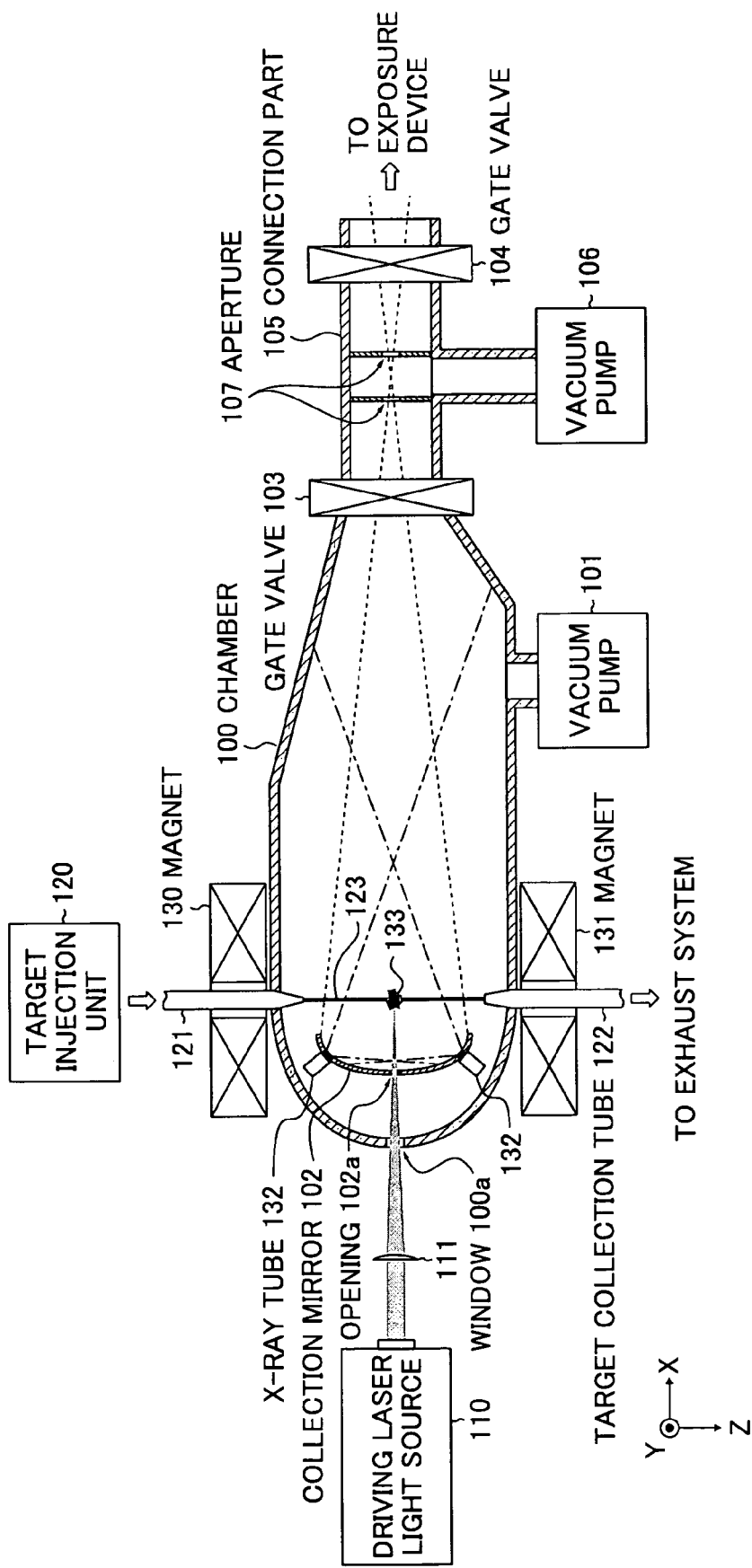
FIG. 1 is a schematic diagram showing a configuration of an EUV light source device according to the first embodiment of the present invention.

Hereinafter, preferred embodiments of the present invention will be described in detail by referring to the drawings. The same reference numerals are assigned to the same component elements and the description thereof will be omitted.

First, a basic configuration of an EUV (extreme ultra violet) light source device will be described by referring to FIG. 1. FIG. 1 is a schematic diagram showing a configuration of an extreme ultra violet light source device according to the first embodiment of the present invention.

The EUV light source device shown in FIG. 1 includes a chamber 100, a driving laser light source 110 for generating a laser beam, an irradiation optical system 111 and a target injection unit 120. Further, in or near the chamber 100, a vacuum pump 101, a collection mirror 102, a target injection nozzle 121 and a target collection tube 122 are provided.

The air within the chamber 100 is exhausted by the vacuum pump 101, and thereby, maintained at a predetermined pressure.

The driving laser light source 110 generates a laser beam for providing energy to a target material for excitation. Further, the irradiation optical system 111 collects the laser beam generated from the driving laser light source 110 and introduces the beam into the chamber 100. In the embodiment, the irradiation optical system 111 is formed by a collection lens. As the collection lens, a plano-convex lens, cylindrical lens or a combination of those lenses may be used. A window 100a and an opening 102a are respectively formed in the chamber 100 and the collection mirror 102, which will be described later, and the laser beam collected by the irradiation optical system 111 passes through the window 100a and the opening 102a and applied to the target material within the chamber 100.

The target injection unit 120 supplies a target material for generating plasma to the target injection nozzle 121. As the target material, various materials may be used such as xenon (Xe), a mixture containing xenon as a principal component, argon (Ar), krypton (Kr) or a material which becomes a gas state in a low pressure condition such as water ($H_2O$), alcohol or the like. Further, the state of the target may be any one of gas, liquid and solid. In the embodiment, liquid target jets or droplets are injected toward a Z-direction (downward in the drawing) from the target injection nozzle 121 by cooling xenon under high pressure in the target injection unit.

A target material 123 is turned into plasma by applying the laser beam output from the driving laser light source 110 to the target material injected from the target injection nozzle 121. At that time, EUV light is emitted from the generated plasma. Hereinafter, the plasma is referred to as "EUV light generation plasma".

The collection mirror 102 is used as a collection optical system for collecting the EUV light emitted from the plasma and guiding the light in a desired direction. In FIG. 1, the broken line shows the range of optical paths of EUV light. The collection mirror 102 has a reflection surface of a parabolic, spherical or ellipsoidal concave surface, or a spherical surface having plural curvatures, and a coating for selectively reflecting a predetermined wavelength component is formed on the reflection surface. For example, when xenon is used as the target material, a wide variety of light from the generated plasma to X-ray and infrared light is emitted. Since a strong peak appears near 11 nm and 13.5 nm with respect to the EUV region, the wavelength component near 13.5 nm can be collected with high efficiency using the collection mirror 102 on which an Mo (molybdenum)/Si (silicon) film has been formed.

The target collection tube 122 is opposed to the injection tip of the target injection nozzle 121, and collects the target material that has not contributed to plasma generation of the target material 123 injected from the target injection nozzle 121 and debris produced at the time of plasma generation.

Such a chamber 100 is connected to an exposure device via a connection part 105 provided with gate valves 103 and 104. The gate valves 103 and 104 are used at the time of maintenance of the chamber 100 or the exposure device or the like. The connection part 105 is exhausted by a vacuum pump 106 and maintained at a predetermined pressure. The vacuum pump 106 may be omitted in view of the vacuum pump 101. Partitions formed with apertures 107 are disposed inside of the connection part 105, and the EUV light generated in the chamber 100 enters the exposure device through the apertures 107. At that time, the gate valves 103 and 104 are held open for the EUV light to pass through.

In the embodiment, further to such an EUV light source device, magnets 130 and 131 and plural X-ray tubes 132 are provided as a mechanism for preventing damage to the collection mirror by debris. In the embodiment, electromagnets are used as the magnets 130 and 131 and FIG. 1 shows a state that electromagnetic coils are provided around the target injection nozzle 121 and the target collection tube 122 outside of the chamber 100. In FIG. 1, a power supply and wiring for supplying power to the electromagnets are omitted.

Figure 2:
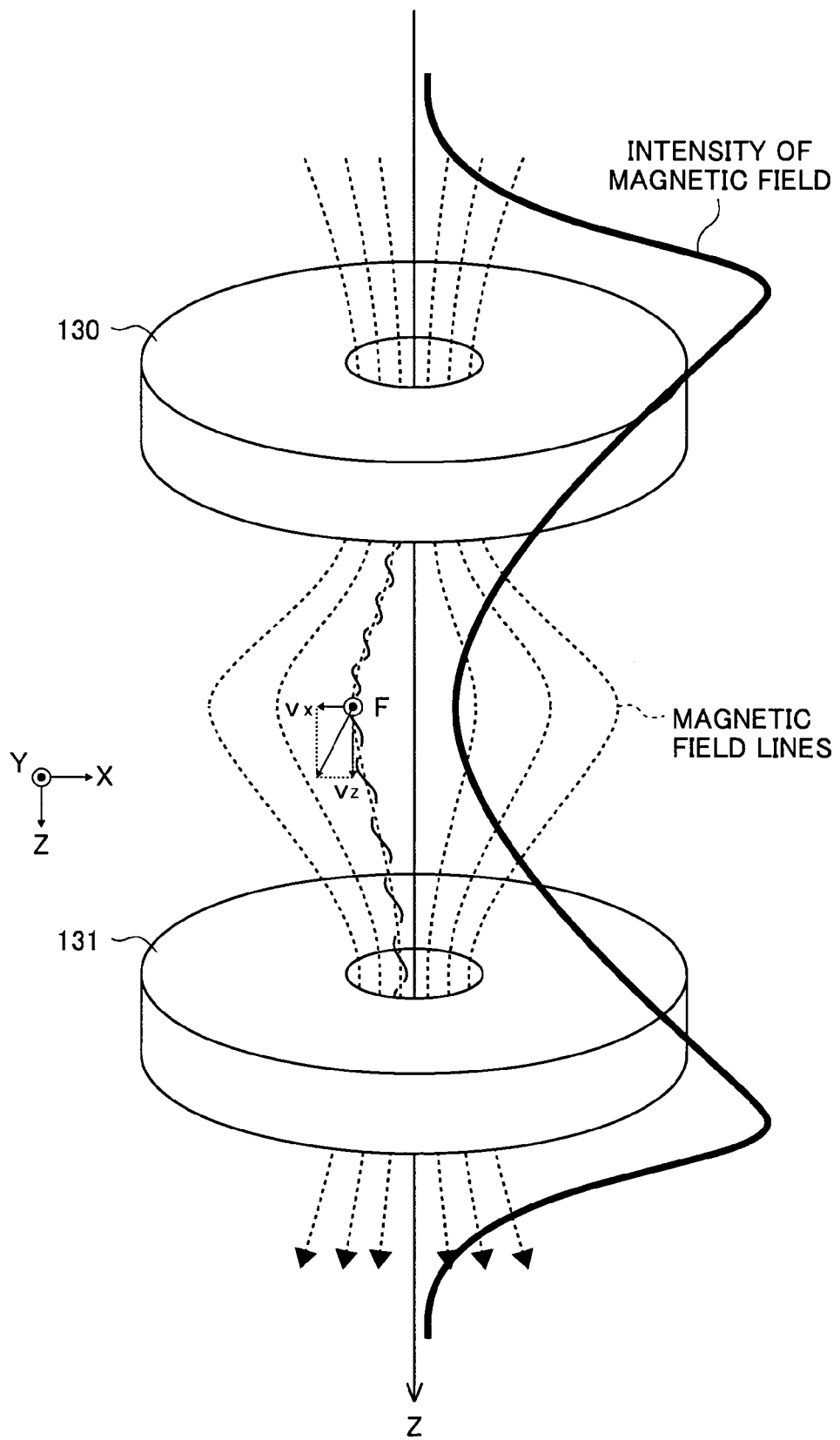
FIG. 2 is a schematic diagram showing a state of a magnetic field formed by magnets shown in FIG. 1.

FIG. 2 is a schematic diagram showing a state of a magnetic field formed by the magnets 130 and 131. As shown in FIG. 2, when the coils that form the magnets 130 and 131 are provided with their central axes aligned and current in the same direction is allowed to flow in those coils, a magnetic field is formed in which the magnetic flux density is high near the coils and the magnetic flux density is low at the midway point between the coils. The heavy line shown in FIG. 2 represents the intensity of the magnetic field along the Z-axis.

Figure 3:
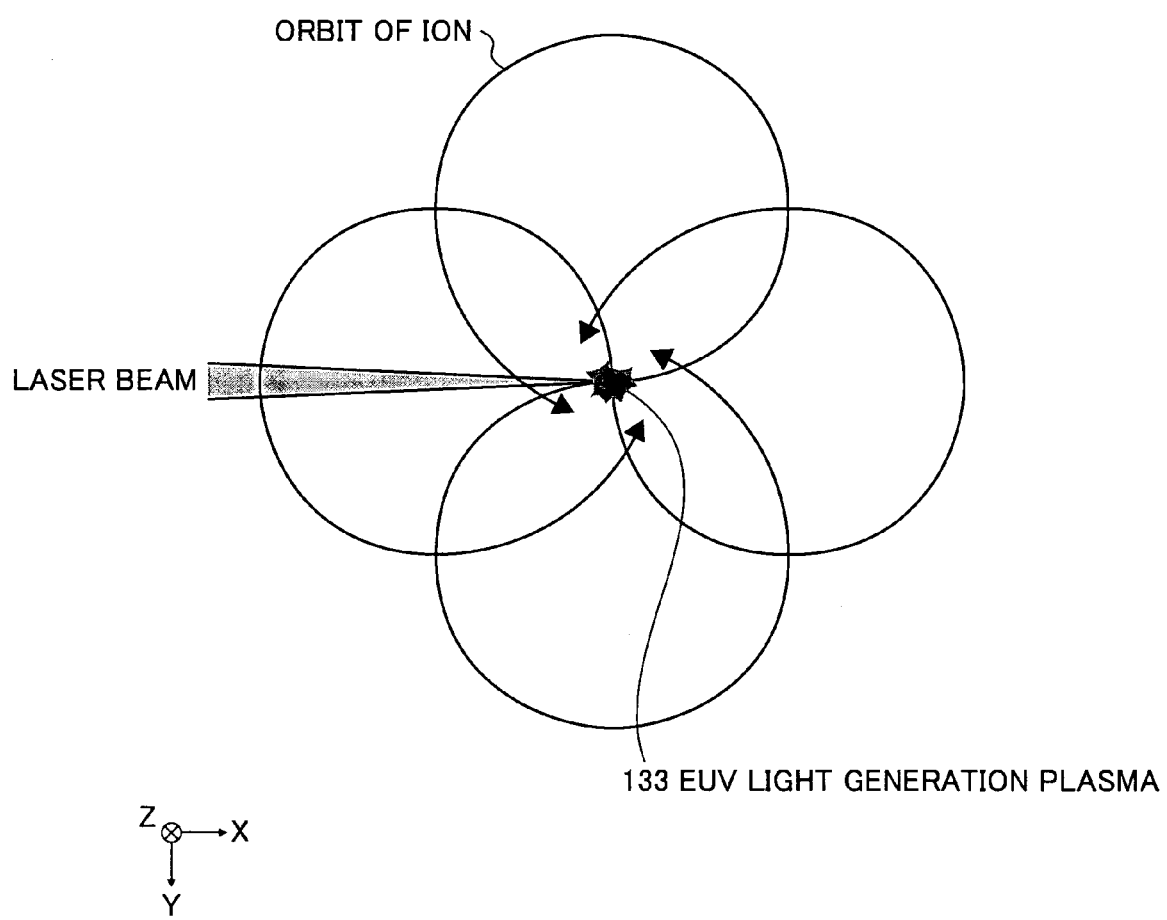
FIG. 3 shows an orbit of an ion trapped by the action of the magnetic field.

Among debris generated from the EUV light generation plasma, charged particle (ions) are deflected because of the Lorentz force applied by the formed magnetic field. For example, as shown in FIG. 2, a positive ion having a velocity $v_X$ in a direction perpendicular to the Z-axis (negative X direction in FIG. 2) is subject to a force F in a tangential direction of a circle around the Z-axis (positive Y direction in FIG. 2). As shown in FIG. 3, such an ion moves while depicting a rotating orbit in the XY plane. On the other hand, the velocity component $V_Z$ of the ion is hardly subject to the action of the magnetic field. As a result, the ion in the magnetic field moves while depicting a helical orbit as shown in FIG. 2 and is trapped near the Z-axis and collected by the target collection tube 122 shown in FIG. 1.

Referring to FIG. 1 again, the plural X-ray tubes 132 are provided on the backside of the collection mirror 102 in which openings have been partially formed. These X-ray tubes 132 apply X-rays toward the front side of the collection mirror 102 via the openings. As a result, neutral particles with no electrical charge included in the debris produced from the EUV light generation plasma are ionized (photo-ionized) by being applied with X-rays and become charged particles. A number of X-ray tubes to be provided may be two as shown in FIG. 1 or more. Alternatively, only one X-ray tube may be used as long as a sufficient range of X-ray application can be secured.

The alternate long and short dash line in FIG. 1 shows the range of X-ray application by the X-ray tubes 132. The X-ray tubes 132 are provided so as to apply X-rays to at least the space between the vicinity of EUV light generation plasma 133 and the collection mirror 102 such that the neutral particles generated from plasma may be ionized before reaching the collection mirror 102. Further, in the embodiment, the application directions of the respective X-ray tubes 132 are determined such that the EUV light generation plasma 133 comes near the center of the range of X-ray application in order to evenly apply X-rays to the neutral particles.

The charged particles ionized by being applied with X-rays are trapped by the action of the magnetic field formed by the magnets 130 and 131 and collected by the target collection tube 122. The principle of trapping the charged particles in the same as has been described by referring to FIGS. 2 and 3.

Thus, according to the embodiment, since ionization is performed by applying X-rays to neutral particles, debris can be trapped with high efficiency by the action of the magnetic field formed within the chamber and collected. Therefore, the life of the collection mirror can be extended substantially by reducing the damage to the collection mirror due to debris. Thereby, the running cost of the EUV light source devices can be suppressed. Further, since the gas hanging within the chamber can be reduced by collecting debris, the collection efficiency of EUV light can be raised by increasing the degree of vacuum within the chamber. Alternatively, since the exhaust ability of the vacuum chamber can be suppressed, the EUV light source device can be formed at a low cost.

Although the neutral particles have been photo-ionized by using X-rays in the embodiment, other electromagnetic wave having a suitable wavelength can be used according to the kind of target material. For example, in the case of using a xenon target, the neutral particles can be photo-ionized if the light has a wavelength of about 90 nm or less. Accordingly, in that case, a light source for generating ultraviolet light having a wavelength of 90 nm or less may be used in place of X-ray tubes.

Further, as the magnets 130 and 131, electromagnets (superconducting magnets) may be used as in the embodiment, or permanent magnets may be used as long as a magnetic field with the required intensity can be formed.

Figure 4:
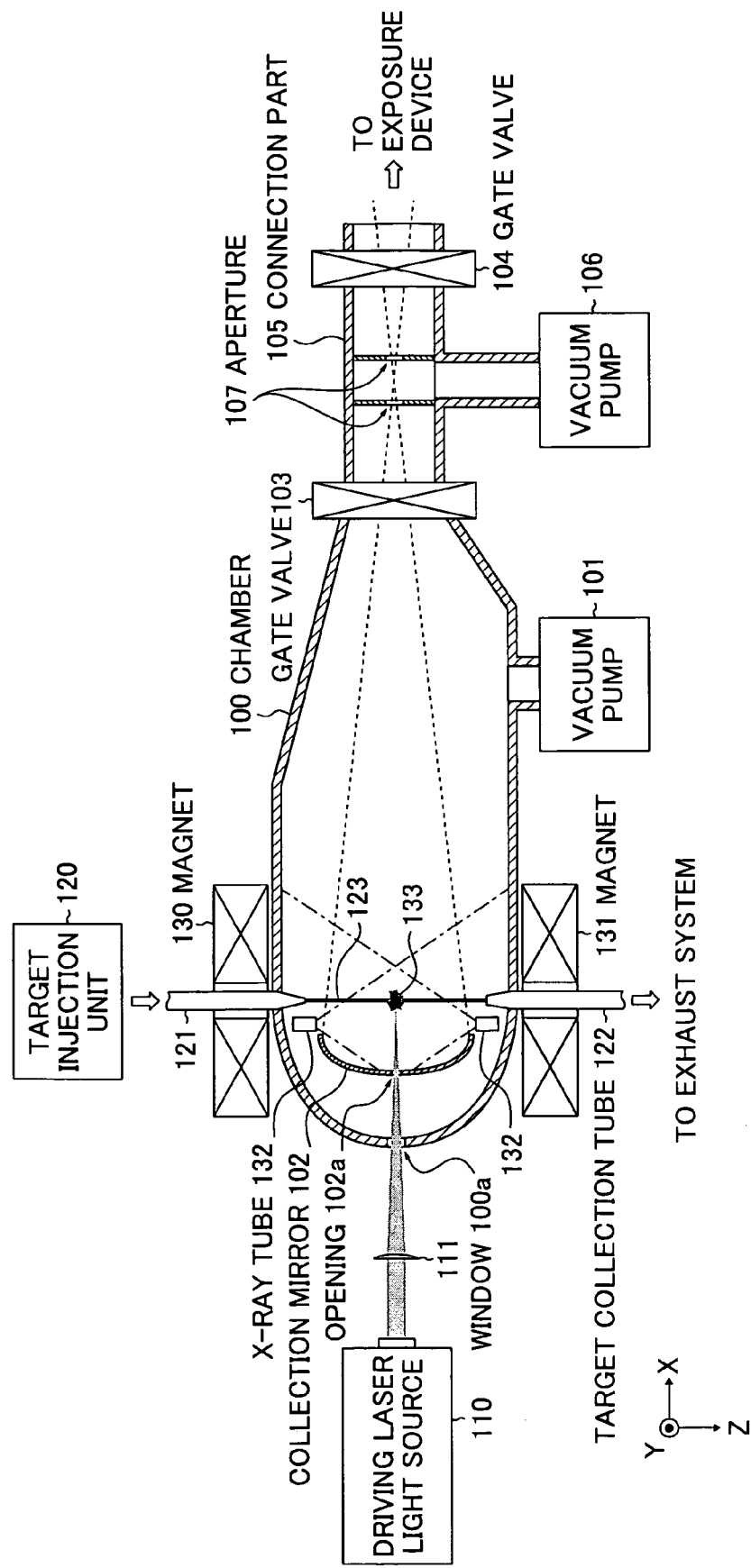
FIG. 4 is a schematic diagram showing a configuration of an EUV light source device according to the second embodiment of the present invention.

FIG. 4 is a schematic diagram showing a configuration of an EUV light source device according to the second embodiment of the present invention. In the embodiment, the X-ray tubes 132 are provided between the EUV light generation plasma 133 and the collection mirror 102. Further, in the embodiment, the application directions of the respective X-ray tubes 132 are determined such that the EUV light generation plasma 133 comes to the end of the range of X-ray application in order to apply X-ray intensively to the space between EUV light generation plasma 133 and the collection mirror 102. The remaining configuration is the same as that of the EUV light source device shown in FIG. 1.

Figure 5:
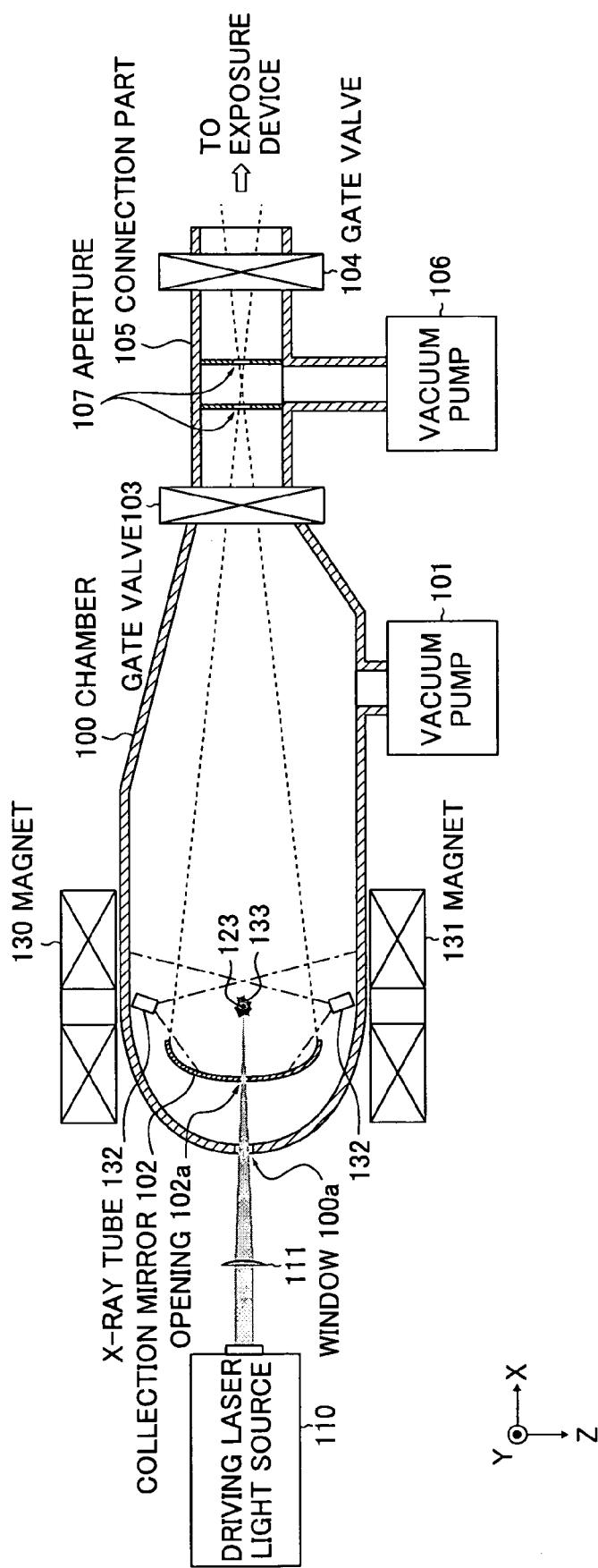
FIG. 5 is a schematic diagram showing a configuration of an EUV light source device according to the third embodiment of the present invention.

FIG. 5 is a schematic diagram showing a configuration of an EUV light source device according to the third embodiment of the present invention.

In the above-mentioned first and second embodiments, the optical path of the laser beam, the orbit of the target material and the arrangement of the X-ray tubes 132 have been illustrated in the same plane, however, they are not necessarily in the same plane. For example, as shown in FIG. 5, the target material 123 may be injected toward the Y-direction (the direction from the back side to the front side of the paper). Further, in the embodiment, the application directions of the respective X-ray tubes are determined such that the central axes of the output X-rays lies the collection mirror in order to apply X-ray intensively to the space between EUV light generation plasma 133 and the collection mirror 102.

Next, variations in the arrangement of the plural X-ray tubes and magnets in the first to third embodiments of the present invention will be described. In the present application, it is defined that the reflection surface, in which a multilayer film or Mo/Si is formed, is the front side (front surface) of the collection mirror. That is, the opposite side thereto is the back side or back surface. Further, the "outside of the collection mirror" means a position farther than the edge of the mirror.

Figure 6B:
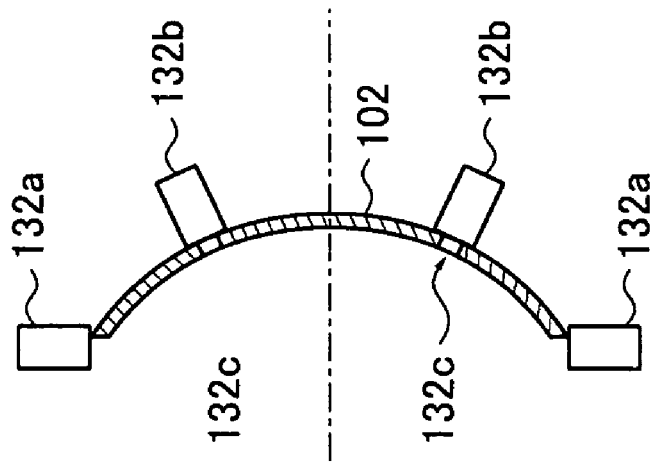
FIGS. 6A and 6B show arrangement examples of X-ray tubes.
Figure 6A:
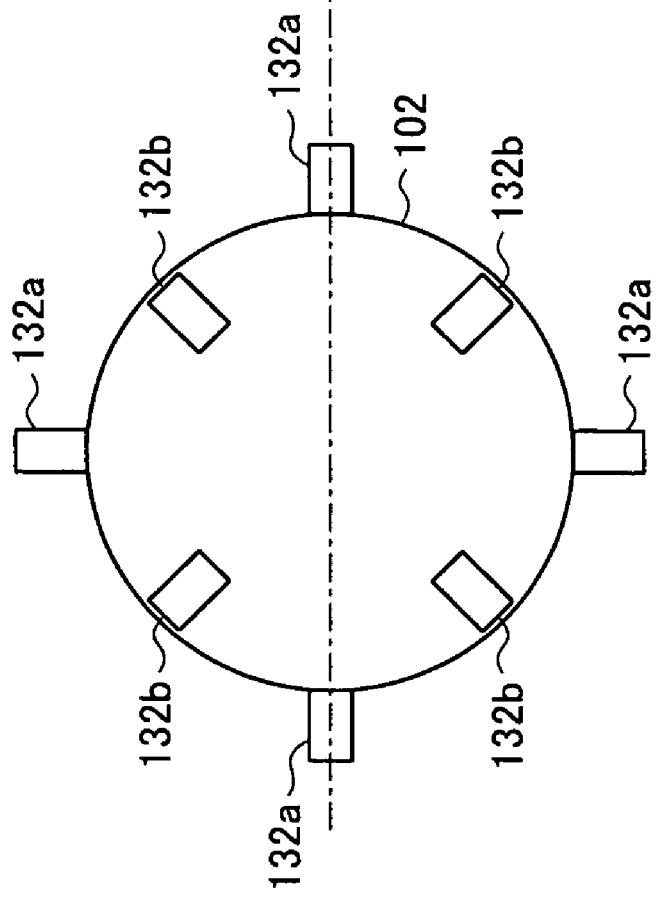

FIGS. 6A and 6B are diagrams for explanation of an arrangement example of the X-ray tubes 132. FIG. 6A shows an arrangement as seen from the back surface of the collection mirror 102 and FIG. 6B shows an arrangement as seen from the side of the collection mirror.

As shown in FIG. 6A, three or more X-ray tubes 132 may be provided within the chamber 100. In this regard, plural X-ray tubes may be provided outside of the collection mirror 102 (X-ray tubes 132a), plural X-ray tubes may be provided on the back side of the collection mirror 102 (X-ray tubes 132b), or they may be provided on both of them. In the case where the X-ray tubes are provided on the back side of the collection mirror as shown in FIG. 6B, openings 132c may be formed in regions for the X-rays to pass through within the collection mirror 102.

FIGS. 7 and 8 are diagrams for explanation of arrangement examples of the magnets 130 and 131.

Here, in the above-mentioned first to third embodiments, the two magnets 130 and 131 have been provided outside of the chamber 100. As merits of the arrangement, there is no possibility that the magnets become impurity sources within the chamber in the case of using permanent magnets as the magnets 130 and 131, and there is no need to provide a cooling water pipe or current cable within the chamber in the case of using electromagnets as the magnets 130 and 131, etc. However, in the arrangement, since the distance between the magnets 130 and 131 and the EUV light generation plasma 133 becomes longer, sometimes the magnets 130 and 131 are required to be upsized for forming a sufficiently strong magnetic field around the EUV light generation plasma 133.

FIG. 7 shows an example in which the magnets 130 and 131 are provided inside of the chamber 100. According to such an arrangement, there is a merit in using small magnets because the distance between the magnets 130 and 131 and the EUV light generation plasma 133 becomes shorter.

FIG. 8 shows an example in which part of the wall surface of the chamber 100 is formed by the magnets 130 and 131 by forming at least a part of the chamber wall in a flange shape. According to such an arrangement, in the case of using electromagnets as the magnets 130 and 131, there is a merit in that the magnets can be brought closer to the EUV light generation plasma 133 while a cooling water pipe, current cable, etc. can be provided outside of the chamber.

Thus, the arrangement of the magnets 130 and 131 can be appropriately selected according to the factors such as the kind of magnets to be used, the intensity of the necessary magnetic field, etc.

Figure 9:
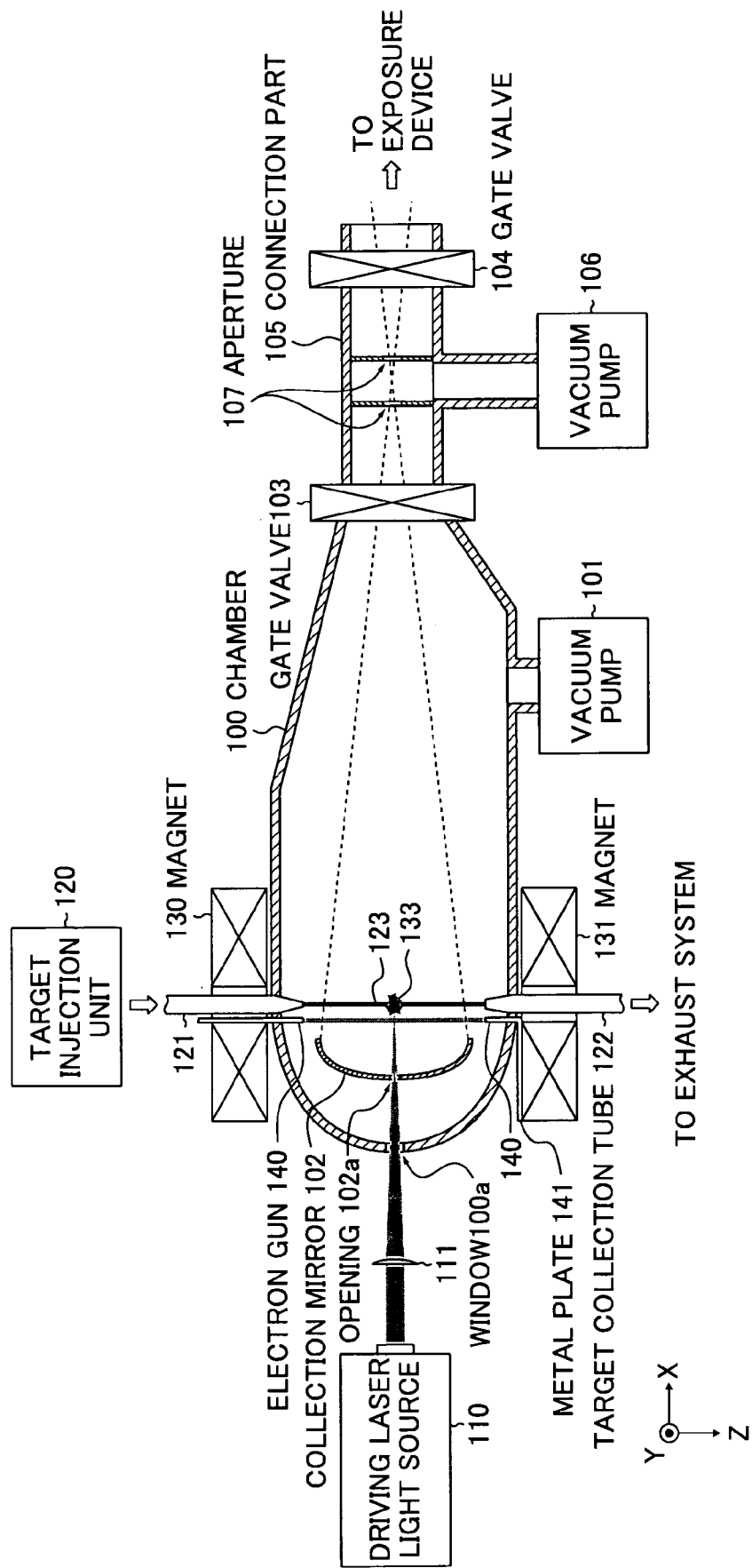
FIG. 9 is a schematic diagram showing a configuration of an EUV light source device according to the fourth embodiment of the present invention.

FIG. 9 is a schematic diagram showing a configuration of an EUV light source device according to the fourth embodiment of the present invention. In the embodiment, electrons are supplied to neutral particles by using an electron gun for ionizing the neutral particles contained in debris.

As shown in FIG. 9, in the EUV light source device according to the embodiment, an electron gun 140 and a metal plate 141 are provided in place of the X-ray tubes 132 shown in FIG. 1. The remaining configuration is the same as that of the EUV light source device shown in FIG. 1.

Figure 10:
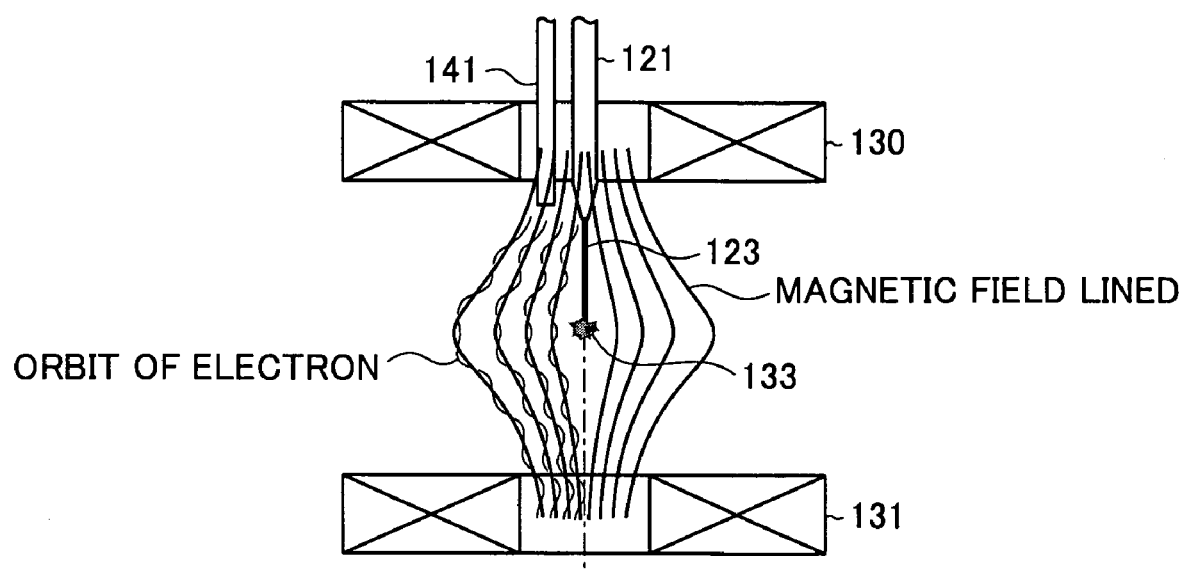
FIG. 10 is a diagram for explanation of an orbit of an electron emitted from an electron gun in a magnetic field.

Referring to FIG. 10, when electrons are emitted from the electron gun 140 along the magnetic field lines, the electrons move so as to wind around the magnetic field lines by Lorentz force. Accordingly, the electrons move around the EUV light generation plasma 133 while hardly diffusing, and at that time, the electrons collide with neutral particles flying from the plasma. As a result, ionized charged particles are trapped by the action of the magnetic field formed by the magnets 130 and 131.

In the embodiment, the electron gun 140 has been used as an example of electron supply source, however, other electron supply sources may be used. Further, the metal plate 141 has been provided within the chamber 100 in order to receive the electrons emitted from the electron gun 140, however, the electrons may be received by the chamber wall surface, and metal plate 141 is not necessary to be provided in that case.

Figure 11:
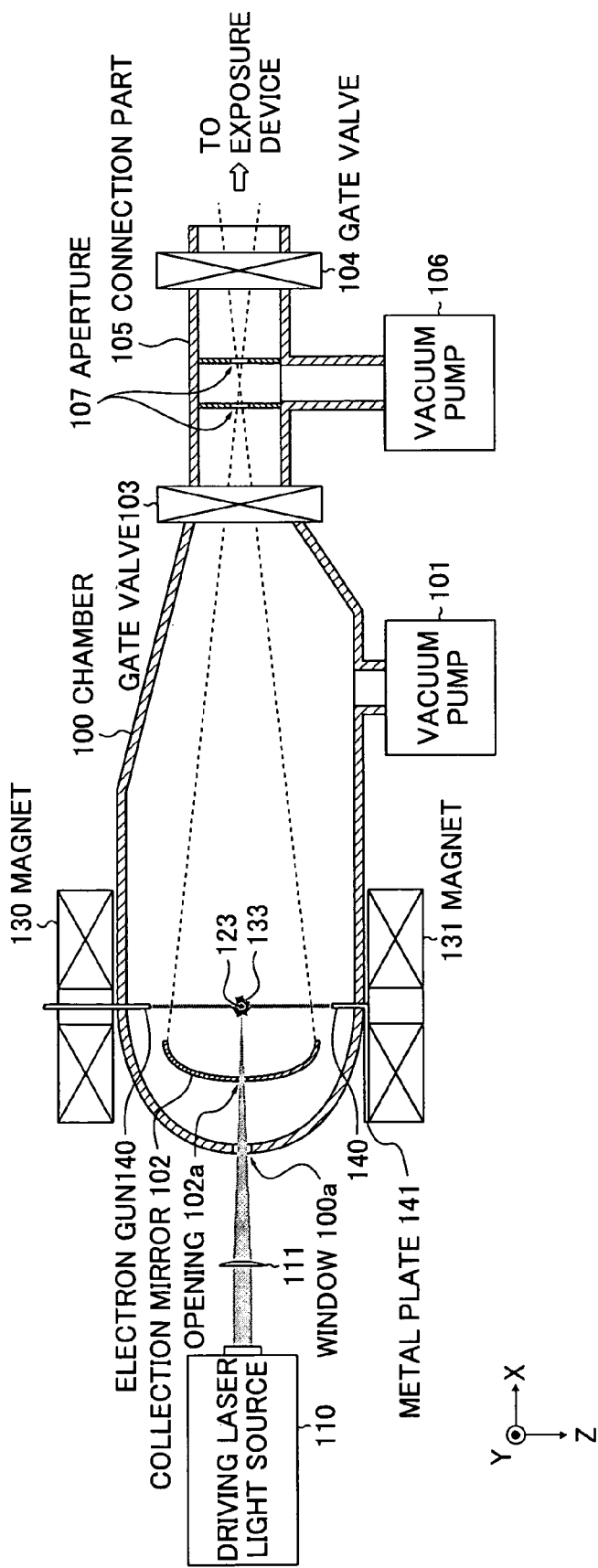
FIG. 11 is a schematic diagram showing a modified example of the EUV light source device shown in FIG. 9.

FIG. 11 is a schematic diagram showing a modified example of the EUV light source device shown in FIG. 9. In the EUV light source device shown in FIG. 11, the target material 123 is injected toward the Y-direction. Thus, the size and the degree of freedom of arrangement of the electron gun can be increased by providing the electron gun perpendicularly to the plane (XY plane) including the optical path of the laser beam and the orbit of the target material.

Figure 12:
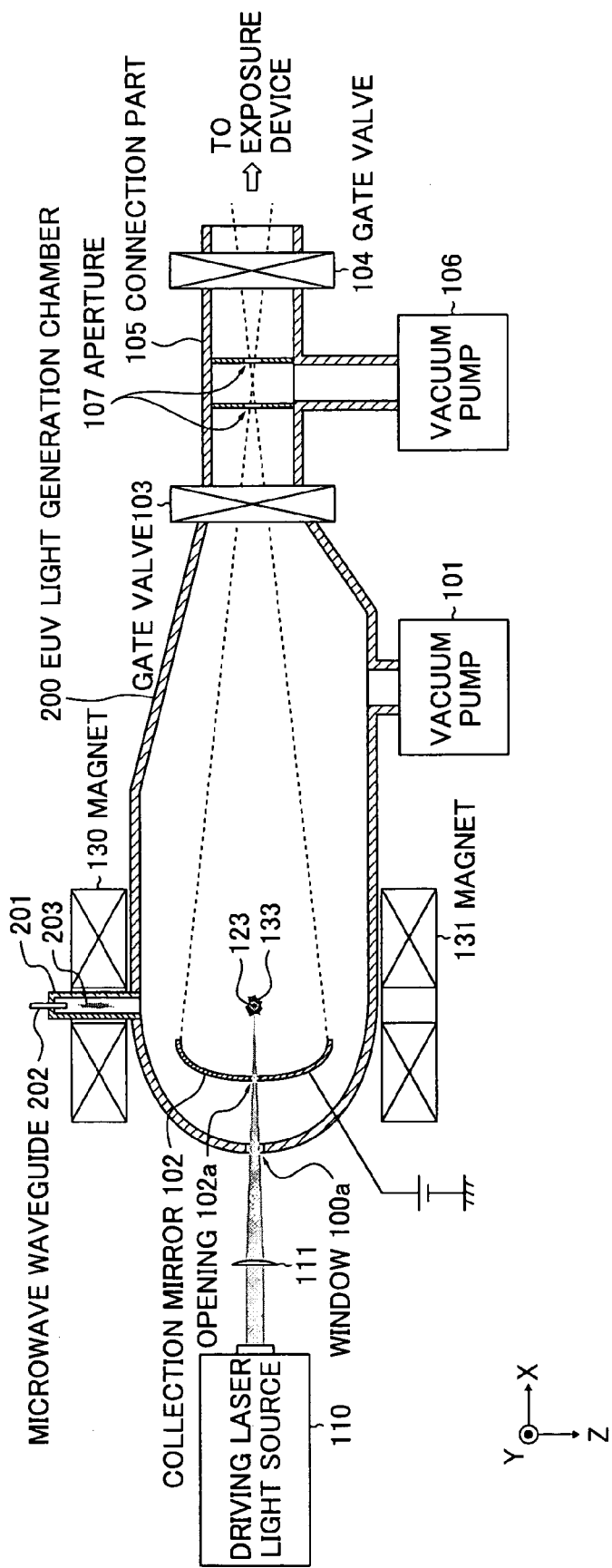
FIG. 12 is a schematic diagram showing a configuration of an EUV light source device according to the fifth embodiment of the present invention.

FIG. 12 is a schematic diagram showing a configuration of an EUV light source device according to the fifth embodiment of the present invention. In the embodiment, plasma is allowed to collide with neutral particles to supply electrons in order to ionize the neutral particles contained in debris. Accordingly, plasma for ionizing neutral particles is further generated separately from the EUV light generation plasma.

As shown in FIG. 12, the EUV light source device according to the fifth embodiment has a chamber 200 and a microwave waveguide 202 in place of the chamber 100, the electron gun 140, and the metal plate 141 shown in FIG. 11. In the chamber 200, a glass tube (quartz tube) 201 in which plasma 203 for ionization is generated is provided in a central position of the magnet 130. The remaining configuration is the same as that of the EUV light source device shown in FIG. 11. In FIG. 12, the target material 123 is injected toward the Y-direction.

Figure 13:
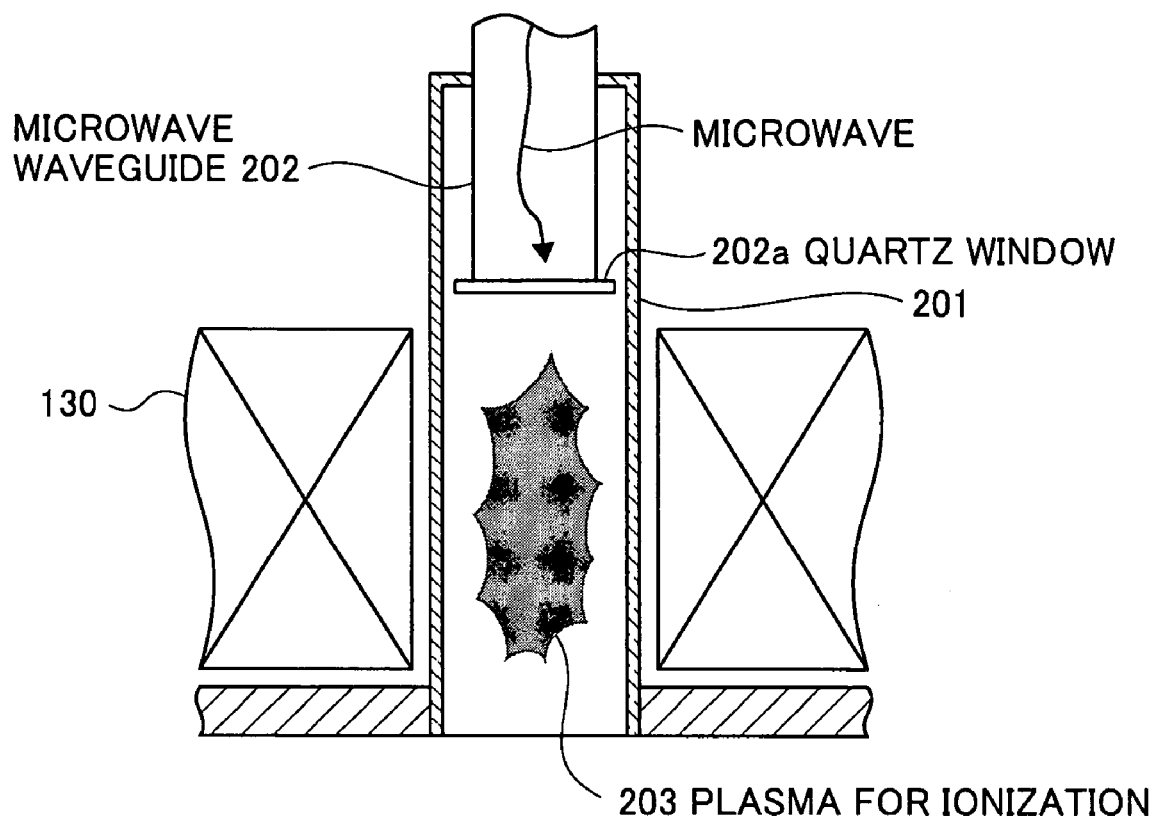
FIG. 13 is a partially enlarged view of a microwave waveguide shown in FIG. 12.

FIG. 13 is a partially enlarged view of the microwave waveguide 202 shown in FIG. 12. As shown in FIG. 13, the microwave waveguide 202 is provided above the magnet 130, microwave is propagated via a quartz window 202a, and thereby, microwave discharge is caused within the chamber 200. Thus, generated plasma 203 for ionization moves in a direction in which the magnetic field becomes weaker, that is, in a direction toward the EUV light generation plasma 133 because of the gradient of the magnetic field formed by the magnets 130 and 131. In the meantime, the plasma 203 for ionization collides with neutral particles flying from the EUV light generation plasma 133 and ionizes them.

Here, the microwave discharge occurs more easily as frequency $\omega$ of the microwave is closer to collision frequency $\nu$ of electrons with neutral particles. Conversely, in the case where the frequency $\omega$ of the microwave is larger when compared to the collision frequency $\nu$ ($\omega \gg \nu$), the microwave discharge becomes difficult to occur.

Alternatively, in order to cause the microwave discharge, ECR (electron cyclotron resonance) may be utilized. That is, in the magnetic field, electrons move while rotating windingly around the magnetic field lines (cyclotron motion). When an alternating current electric field is applied to the magnetic field by entering microwave having frequency $\omega$ consistent with the rotation speed, a phenomenon called electron cyclotron resonance occurs. Thereby, electrons are effectively accelerated and provide great energy, and plasma can be generated. Here, assuming that B is magnetic flux density and Me is the mass of an electron, electron cyclotron frequency f is expressed by $f=eB/(2\pi Me)=2.799 \times 10^6 \times B$. For example, in the case where the magnetic flux density is about 3000 gauss, microwave having a frequency of about 9 GHz may be applied. In such ECR plasma, under pressure of $10^{-4}$ Torr to $10^{-2}$ Torr (0.0133 Pa to 1.33 Pa), electron temperature becomes on the order of Te=5 eV to 15 eV and electron density becomes on the order of $10^{11}$ to $10^{12}$.

Furthermore, as shown in FIG. 12, a positive potential may be provided to the collection mirror 102. Thereby, the collision of ions (ions other than high-speed ions flying from EUV light generation plasma) can be prevented.

Figure 14:
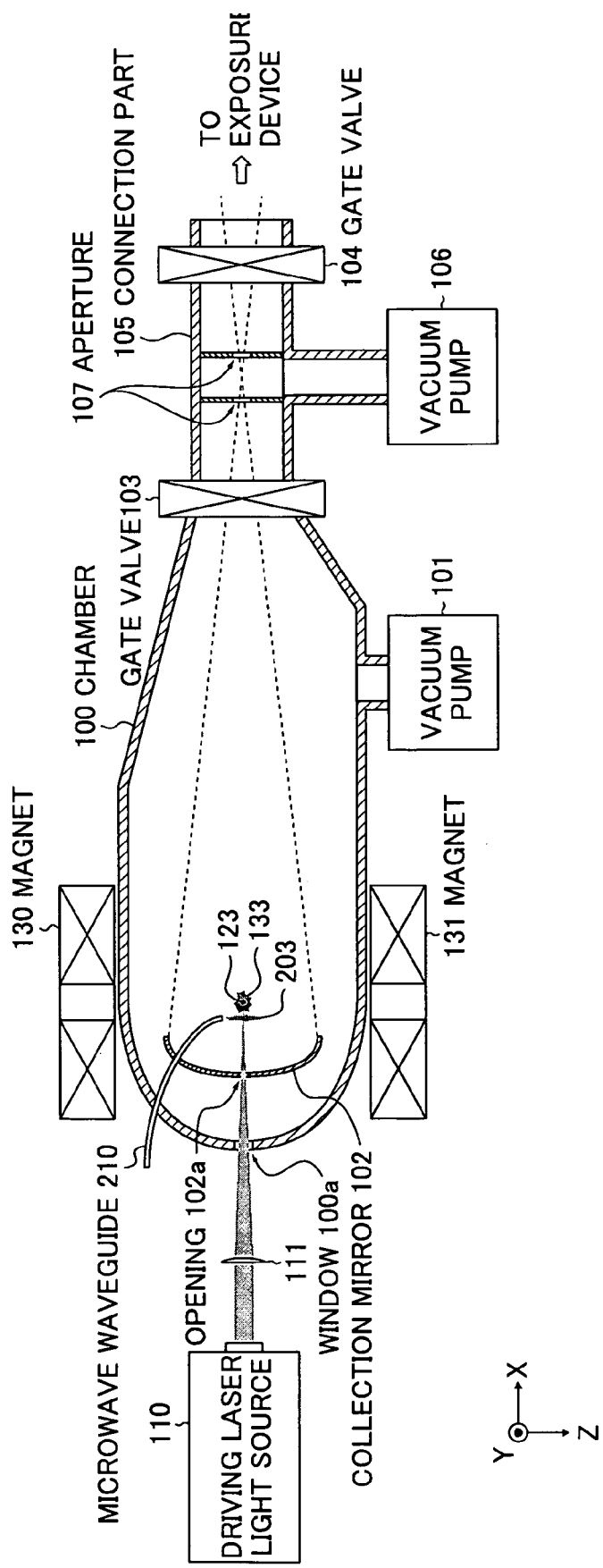
FIG. 14 is a schematic diagram showing a modified example of the EUV light source device shown in FIG. 12.

FIG. 14 is a schematic diagram showing a modified example of the EUV light source device shown in FIG. 12. In the modified example, a microwave waveguide 210 is provided near the EUV light generation plasma 133 and plasma 203 for ionization is generated between the EUV light generation plasma 133 and the collection mirror 102. Thereby, charged particles flying from the EUV light generation plasma and high-speed particles including neutral particles can be prevented from colliding with the collection mirror 102. Further, since the neutral particles flying from the EUV light generation plasma are ionized while passing through the plasma 203 for ionization and trapped by the action of the magnetic field, they can be also prevented from colliding with the collection mirror 102.

Figure 15:
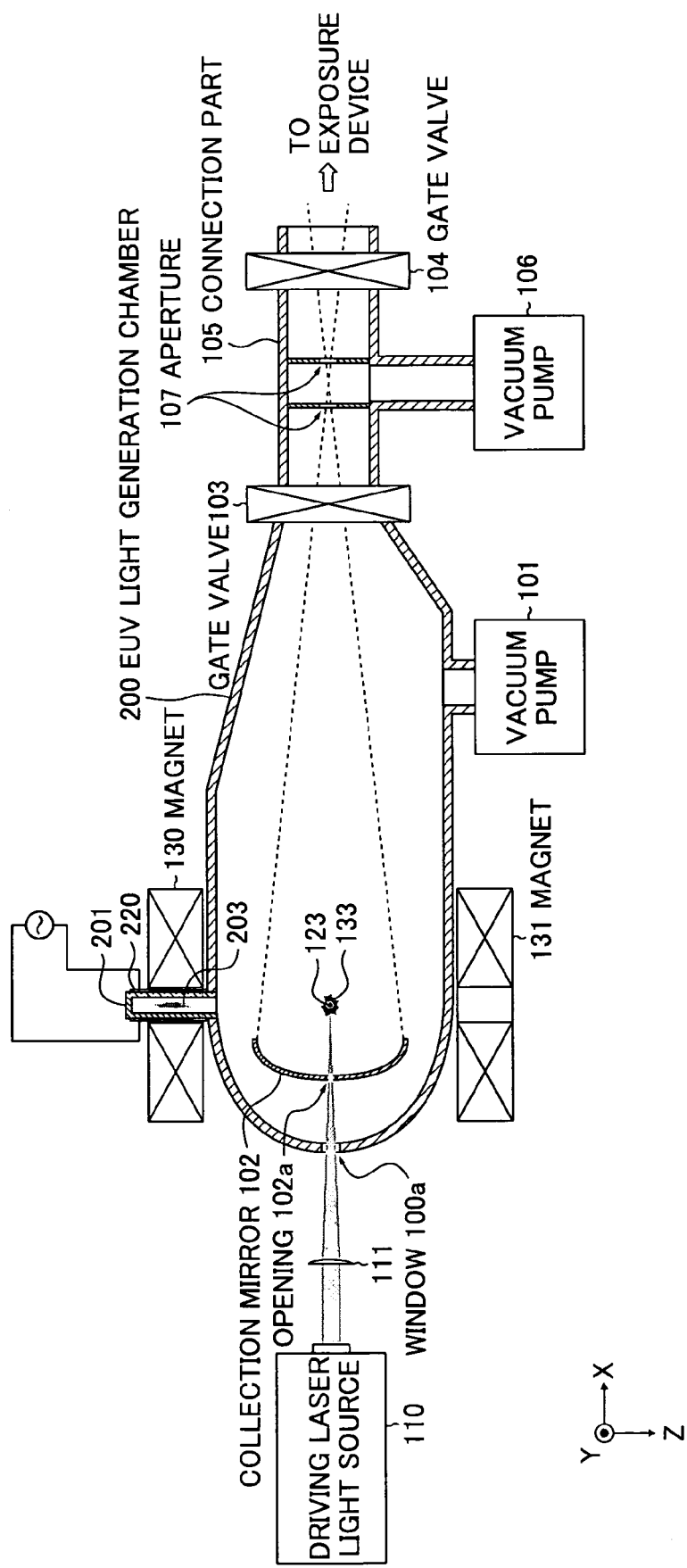
FIG. 15 is a schematic diagram showing a configuration of an EUV light source device according to the sixth embodiment of the present invention.

FIG. 15 is a schematic diagram showing a configuration of an EUV light source device according to the sixth embodiment of the present invention. In the embodiment, plasma 203 for ionization is generated by using high-frequency waves in place of microwaves. As an example, the case of using helicon waves will be described.

Figure 16:
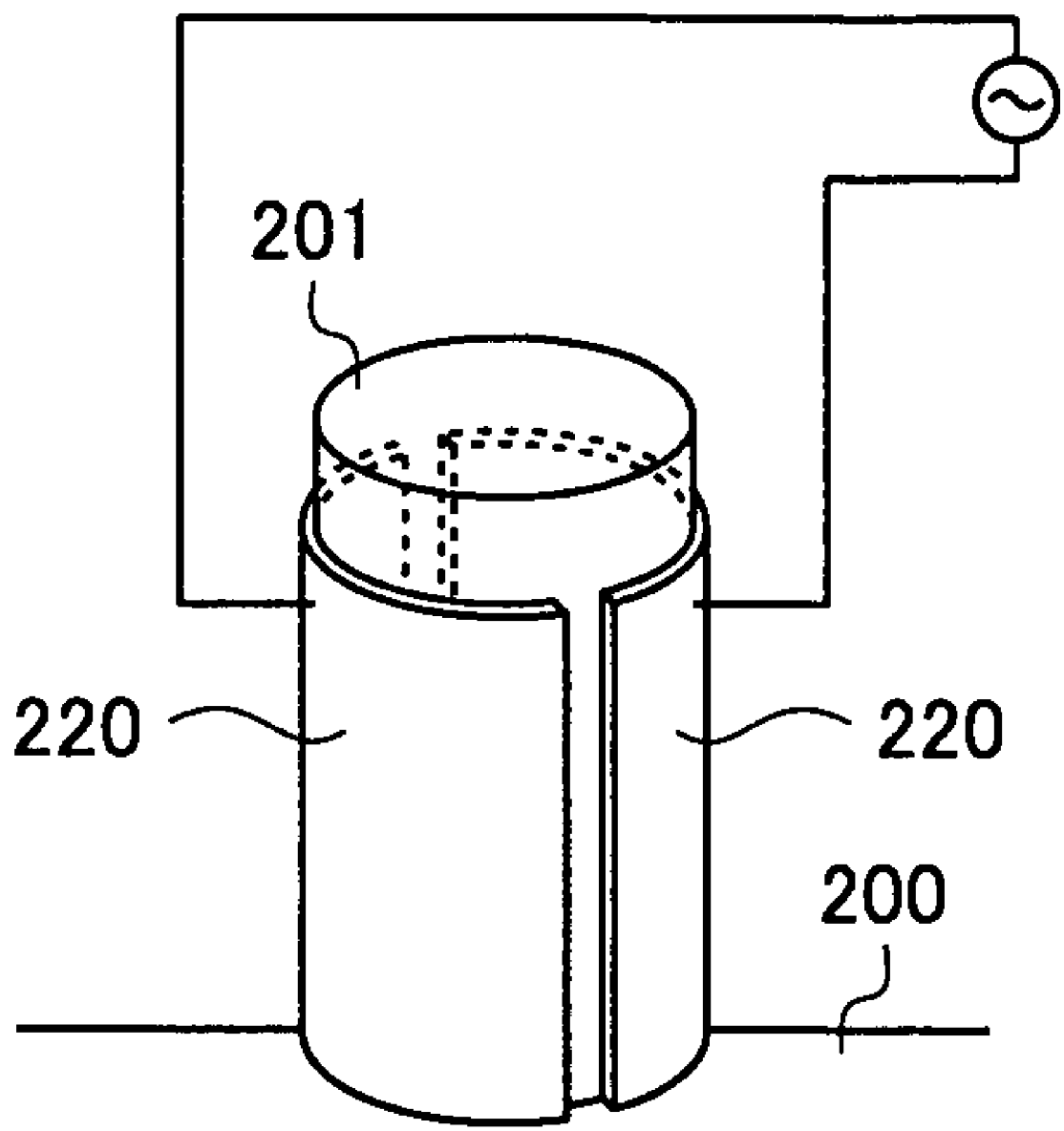
FIG. 16 is an enlarged view of an antenna for helicon wave excitation shown in FIG. 15.

The EUV light source device shown in FIG. 15 has an antenna 220 for helicon wave excitation connected to a high-frequency power supply in place of the microwave waveguide 202 shown in FIG. 12. The remaining configuration is the same as that of the EUV light source device shown in FIG. 12. Further, FIG. 16 is an enlarged view of the antenna 220 for helicon wave excitation. As shown in FIG. 16, the antenna 220 for helicon wave excitation is provided so as to surround a glass tube 201.

In order to generate helicon wave plasma, a high-frequency wave of, for example, 13.56 MHz is applied to the antenna 220 for helicon wave excitation by the high-frequency power supply and, for example, a magnetic field of 1000 gauss or less is formed within the glass tube 201 by a magnet (electromagnetic) 130 (FIG. 15). Thereby, helicon wave plasma is generated within the glass tube 201. Typically, in the case where an antenna is provided around a quartz tube having a diameter of 5 cm, when a magnetic field of 1000 gauss is applied in an argon (Ar) atmosphere of 0.47 Pa, plasma at an electron temperature of about 4 eV with an electron density on the order of $2 \times 10^{13}$ to $3 \times 10^{13}$ $cm^{-3}$ is formed.

Thus, generated plasma 203 for ionization moves to the vicinity of the EUV light generation plasma 133 by the action of the magnetic field formed by the magnets 130 and 131, collides with neutral particles flying from the EUV light generation plasma and ionizes them.

Figure 17:
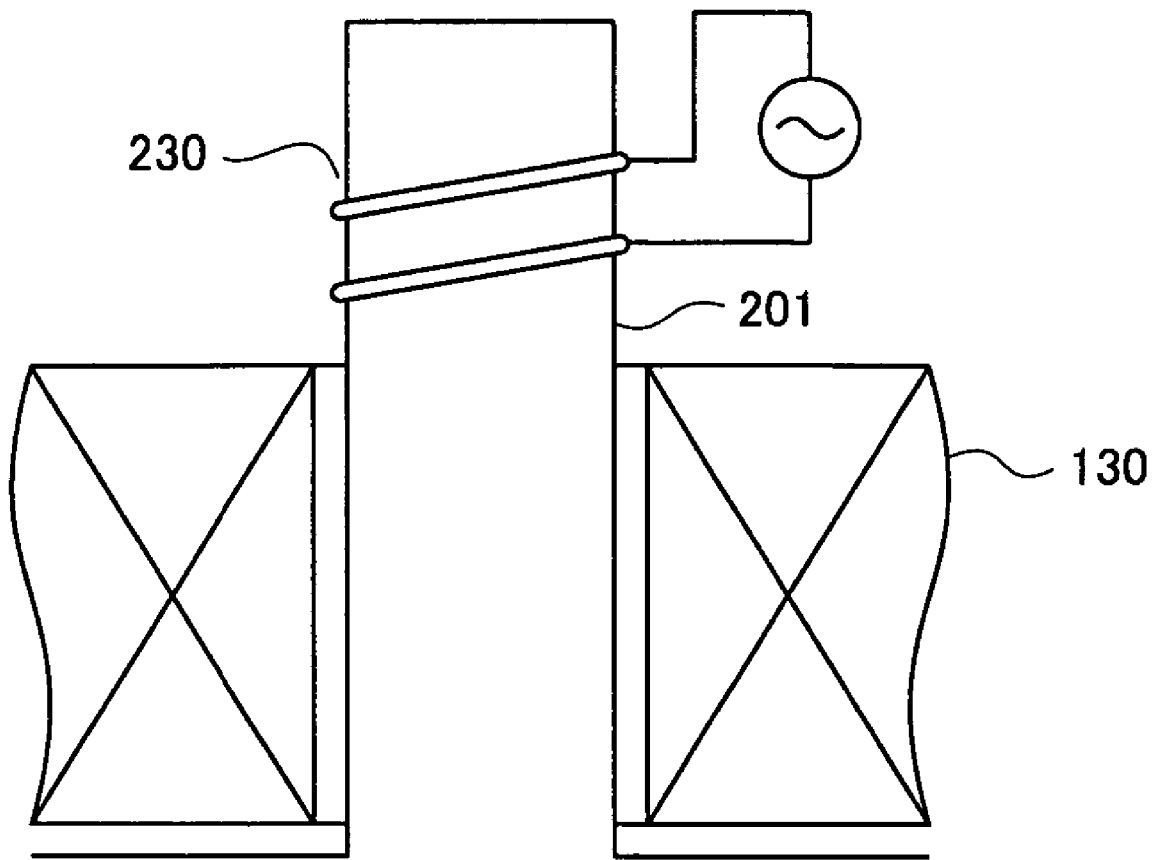
FIG. 17 is a schematic diagram showing a modified example of the EUV light source device shown in FIG. 15.

FIG. 17 is a schematic diagram showing a modified example of the EUV light source device shown in FIG. 15. In the modified example, a coil 230 is wound around the glass tube 201 about one to two turns and connected to the high-frequency power supply, and thereby, inductively coupled plasma (ICP) is generated as plasma for ionization.

Figure 18:
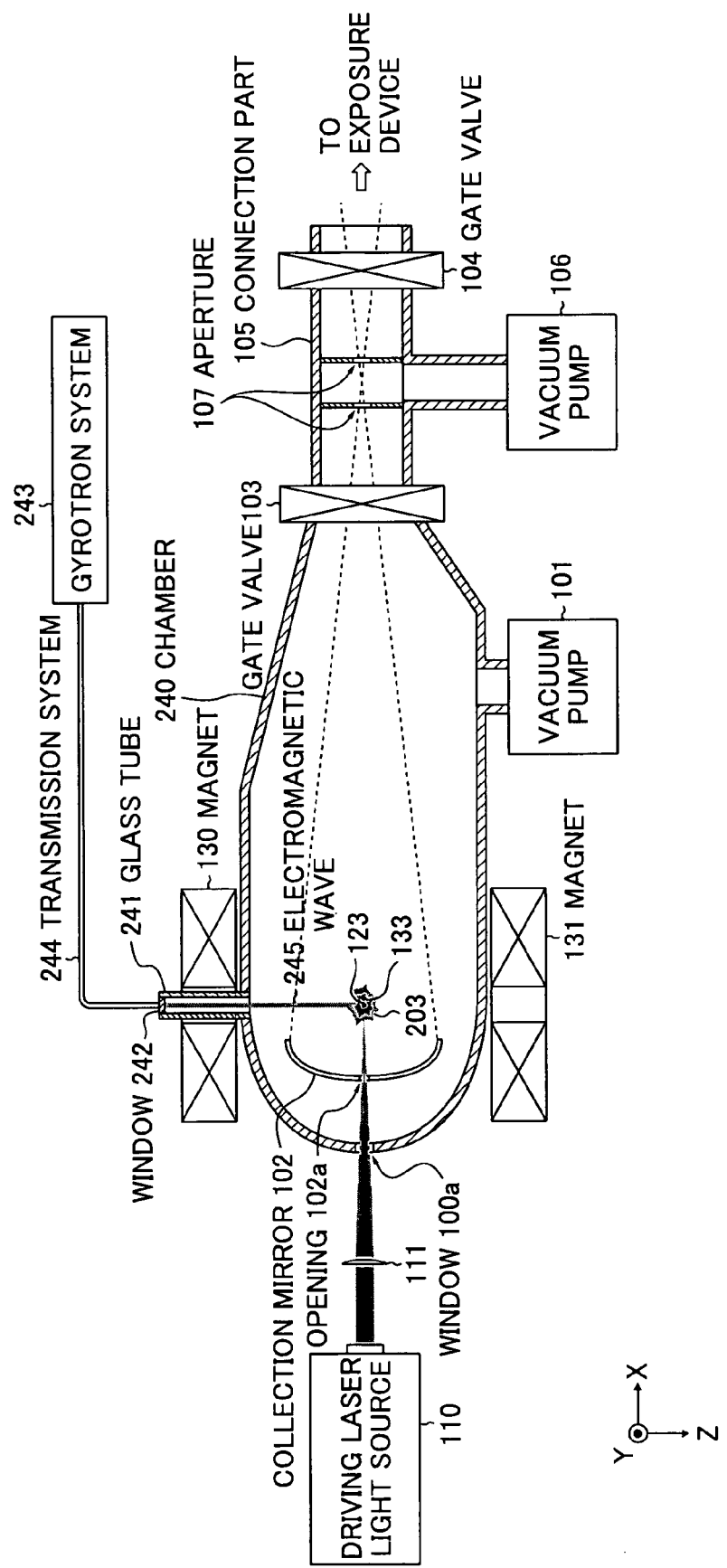
FIG. 18 is a schematic diagram showing a configuration of an EUV light source device according to the seventh embodiment of the present invention.

FIG. 18 is a schematic diagram showing a configuration of an EUV light source device according to the seventh embodiment of the present invention. In the embodiment, plasma for ionization is generated by using a gyrotron.

Here, gyrotron refers to a millimeter or sub-millimeter light source with "cyclotron resonance maser action" utilizing mass change of electron because of relativistic effect as an oscillation principle. Features of its operation are as follows: (1) ability of high-efficiency operation up to a beam efficiency of 30% to 50%; (2) ability of high-power operation by injection of a high-energy high-current electron beam; and (3) tunability of wavelength can be achieved by changing settings for cyclotron frequency. There is an advantage in that plasma heating can be locally performed because electromagnetic waves can be entered into a desired position as if it were a laser beam by using high-frequency waves in an electron cyclotron wave band (millimeter wave band). Further, there is also a great advantage in that an electromagnetic field generating device can be provided separately from the chamber. As to the details of the gyrotron, please refer to Japan Atomic Power Plant, Naka Institute, "Mechanism of Gyrotron", searched on the Internet on Aug. 18, 2004, <URL:http://www.naka.jaeri.go.jp/rfkanetu/gyrotron.htm>, and Toshitaka IDEHARA, "Remote Sensing of the Atmosphere and the Environment Using a High-power Far-infrared Beam", The Institute of Electronics, Information and Communication Engineers, searched on the Internet on Aug. 18, 2004, <URL:http://www.ieice.org/jpn/books/kaishikiji/200110/20011001-4.html>.

The EUV light source device shown in FIG. 18 has a chamber 240 and in place of the chamber 200 as shown in FIG. 15. A glass tube 241 is provided at the magnet 130 side of the chamber 240 and a window (diamond window) 242 for transmitting electromagnetic waves is provided in part thereof. Further, outside of the chamber 240, a gyrotron system 243 and a transmission system 244 are provided. The remaining configuration in the EUV light source device according to the embodiment is the same as that of the EUV light source device shown in FIG. 15.

The electromagnetic waves in the millimeter band generated in the gyrotron system 243 enter the chamber 240 via the transmission system 244 and the window 242. Plasma 203 for ionization is generated in a desired position within the chamber 240 by the electromagnetic wave 245, and neutral particles flying from the EUV light generation plasma are ionized.

Figure 19:
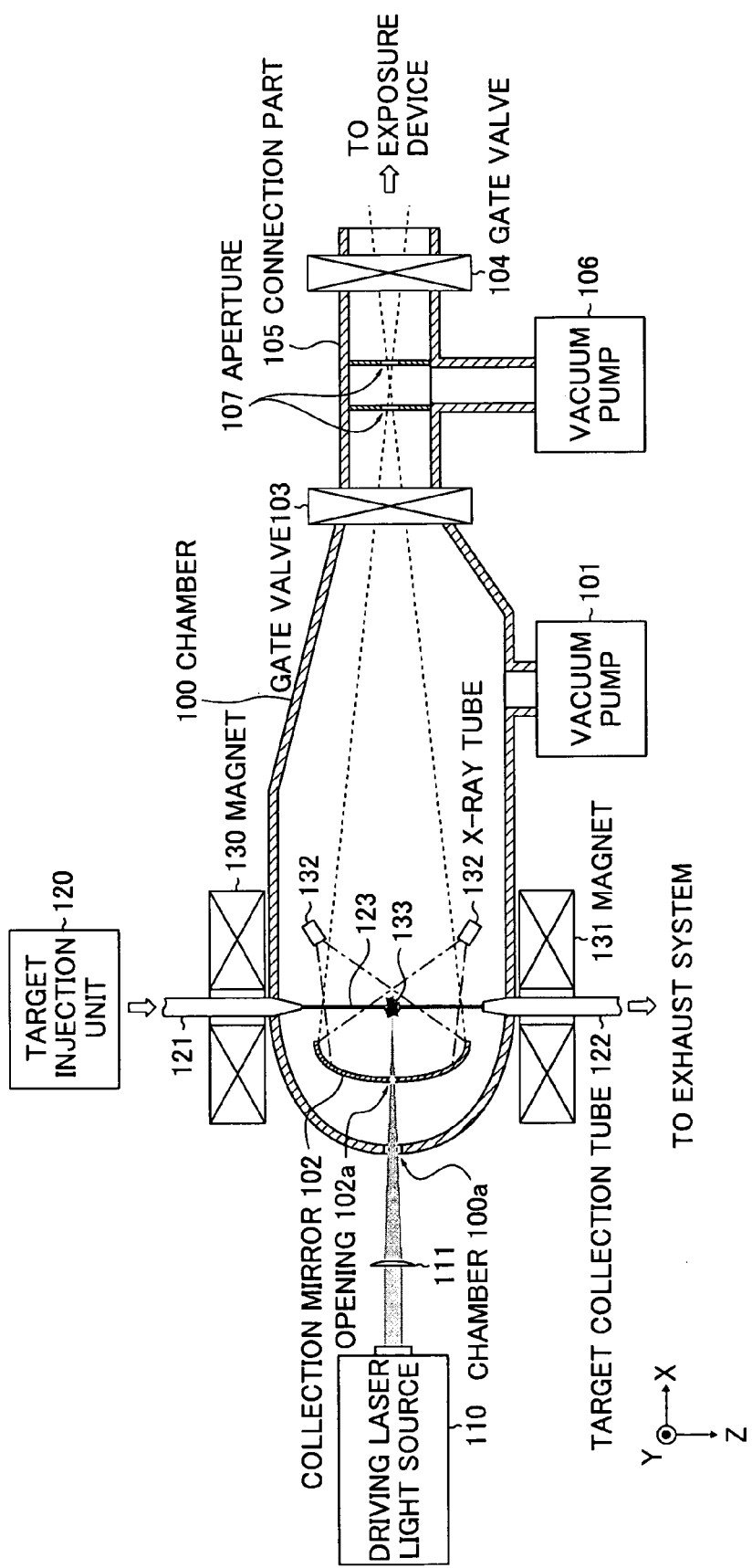
FIG. 19 is a schematic diagram showing a configuration of an EUV light source device according to the eighth embodiment of the present invention.

FIG. 19 is a schematic diagram showing a configuration of an EUV light source device according to the eighth embodiment of the present invention. The EUV light source device shown in FIG. 19 has plural X-ray tubes 132 located farther from EUV light generation plasma seen from the collection mirror 102 compared to the EUV light source device shown in FIG. 1. The remaining configuration is the same as that of the EUV light source device shown in FIG. 1.

By locating the plural X-ray tubes 132 in such a position, regions hidden behind the EUV light generation plasma and applied with no X-ray can be reduced. Further, by the location, the X-ray emitted from the X-ray tube 132 is reflected by the collection mirror 102 and passes through the same region again, and thereby, neutral particles can be ionized with a high rate.

Figure 20:
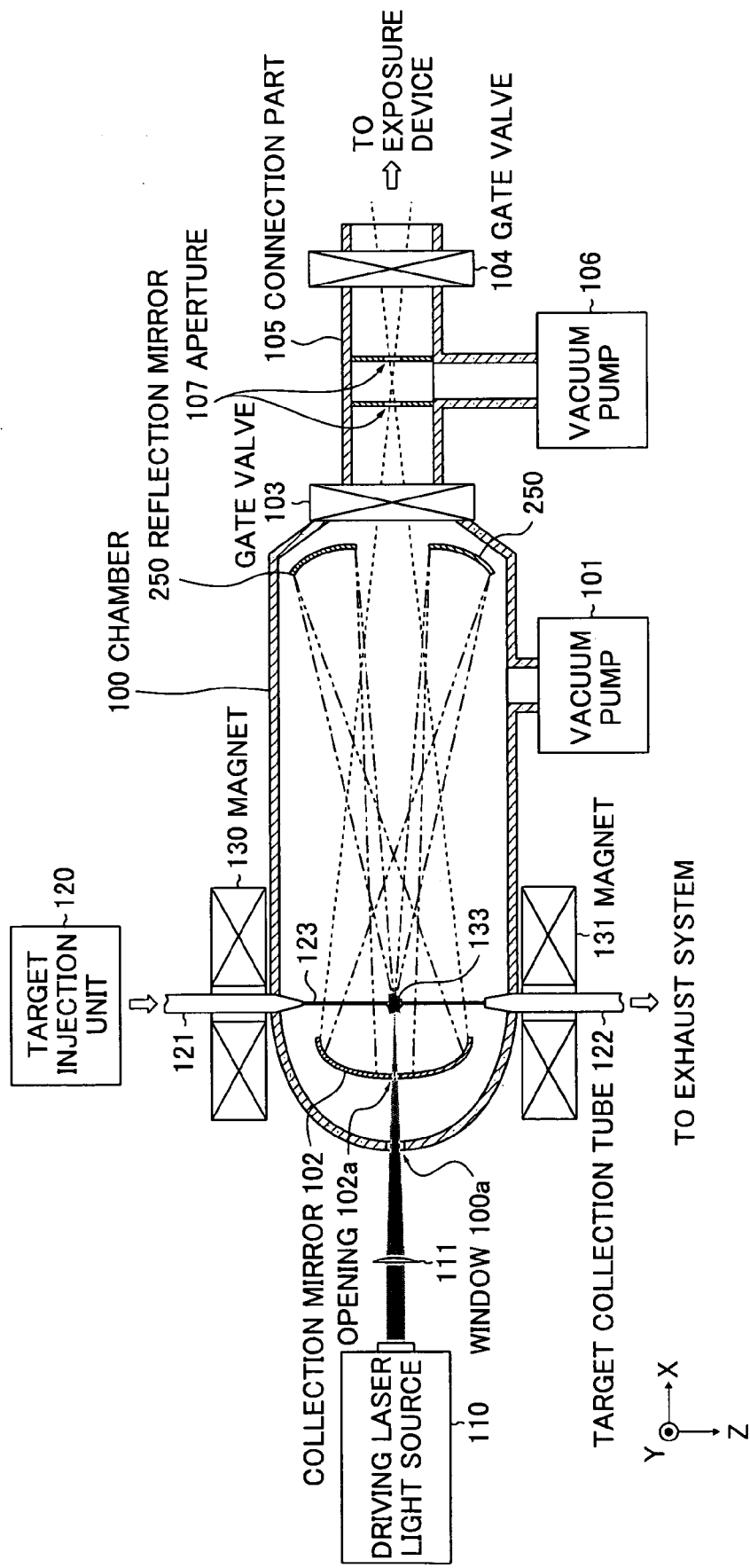
FIG. 20 is a schematic diagram showing a configuration of an EUV light source device according to the ninth embodiment of the present invention.

FIG. 20 is a block diagram showing a configuration of an EUV light source device according to the ninth embodiment of the present invention. In the embodiment, neutral particles are ionized by using a wavelength component contained in the generated EUV light.

Here, the EUV light generated within the chamber 100 contains various wavelength components other than a wavelength component (e.g., near 13.5 nm) to be used for exposure. Those wavelength components are diffused and attenuated without being collected by the collection mirror 102. Accordingly, in the embodiment, a wavelength component of those wavelength components that can photoionize neutral particles within generated debris is utilized. For example, in the case of using a xenon target, wavelength components of 90 nm or less can be utilized for ionization of neutral particles.

The EUV light source device shown in FIG. 20 has a reflection mirror 250 in place of the X-ray tubes 132 shown in FIG. 1. The remaining configuration is the same as that of the EUV light source device shown in FIG. 1. On the reflection surface of the reflection mirror 250, a coating for reflecting the wavelength component near 90 nm, for example, with high efficiency is formed. The reflection mirror 250 is provided in a position and orientation in which the mirror can reflect a predetermined wavelength component emitted from the EUV light generation plasma to the vicinity of the EUV light generation plasma 133 again while avoiding the optical path of EUV light collected by the collection mirror 102. The alternate long and two short dashes line in FIG. 20 shows the optical paths of incident light to the reflection mirror 250 and reflected light. By applying the wavelength component reflected by the reflection mirror 250, the neutral particles flying from the EUV light generation plasma are ionized, and as a result, trapped by action of the magnetic field formed by the magnets 130 and 131.

The configuration for ionizing neutral particles by using such a reflection mirror may be combined with the above-mentioned first to eighth embodiments. Thereby, the ionization efficiency of neutral particles in other embodiments can be improved further.

Figure 21:
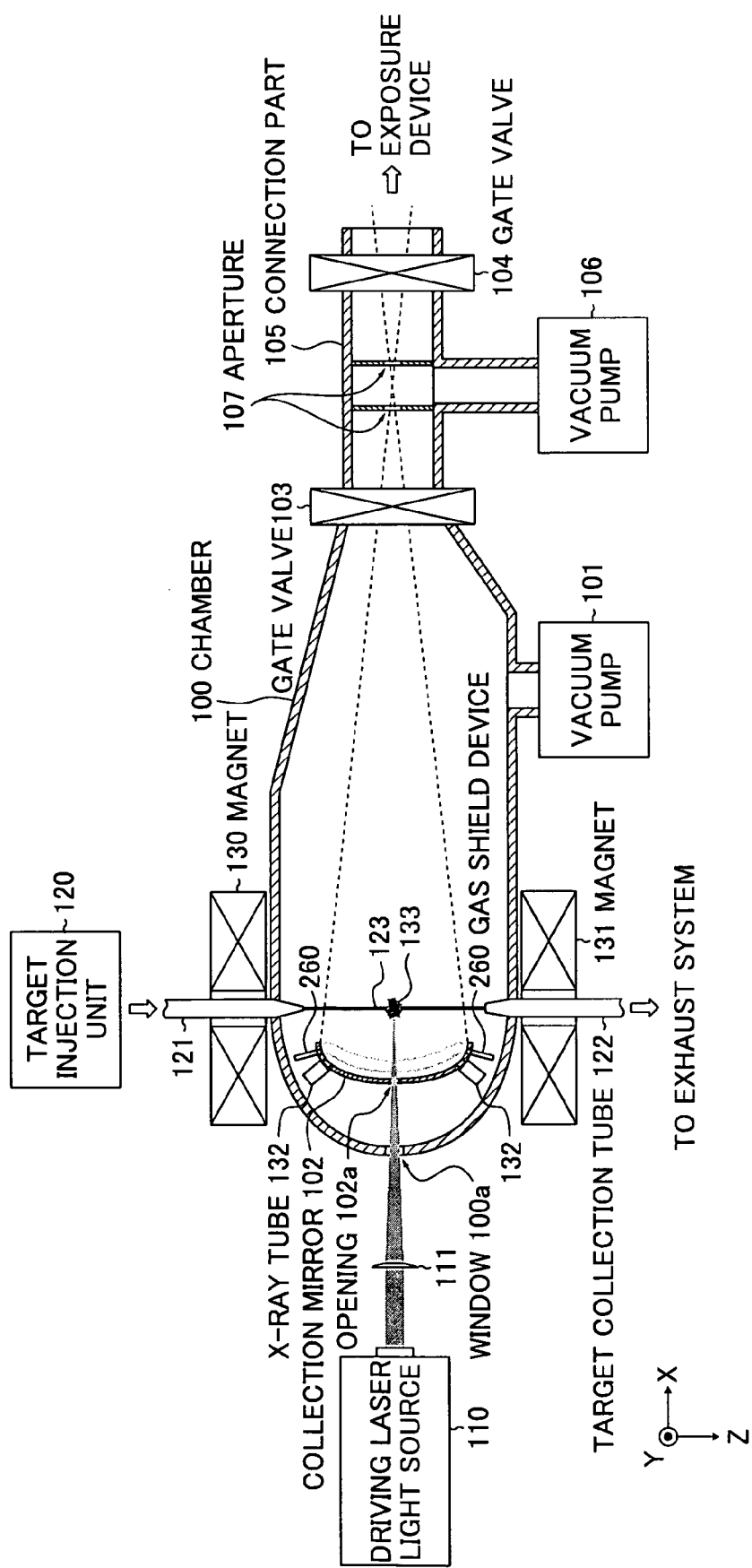
FIG. 21 is a schematic diagram showing a configuration of an EUV light source device according to the tenth embodiment of the present invention.

FIG. 21 is a schematic diagram showing a configuration of an EUV light source device according to the tenth embodiment of the present invention. The EUV light source device shown in FIG. 21 is further provided with a gas shield device 260 for introducing a gas for shielding in addition to the EUV light source device shown in FIG. 1. As the gas for shielding, for example, argon (Ar), helium (He), carbon dioxide ($CO_2$) or the like is used. The remaining configuration is the same as that of the EUV light source device shown in FIG. 1.

In the embodiment, the gas shield device 260 is provided at the back side of the collection mirror 102, and injects the gas for shielding to the front side of the collection mirror 102 via the opening of the collection mirror 102. Thereby, the gas for shielding is introduced between the EUV light generation plasma and the collection mirror, and the collection mirror 102 is shielded from the EUV light generation plasma 133. As a result, the damage to the mirror due to collision of debris with the collection mirror 102 can be prevented.

Figure 22:
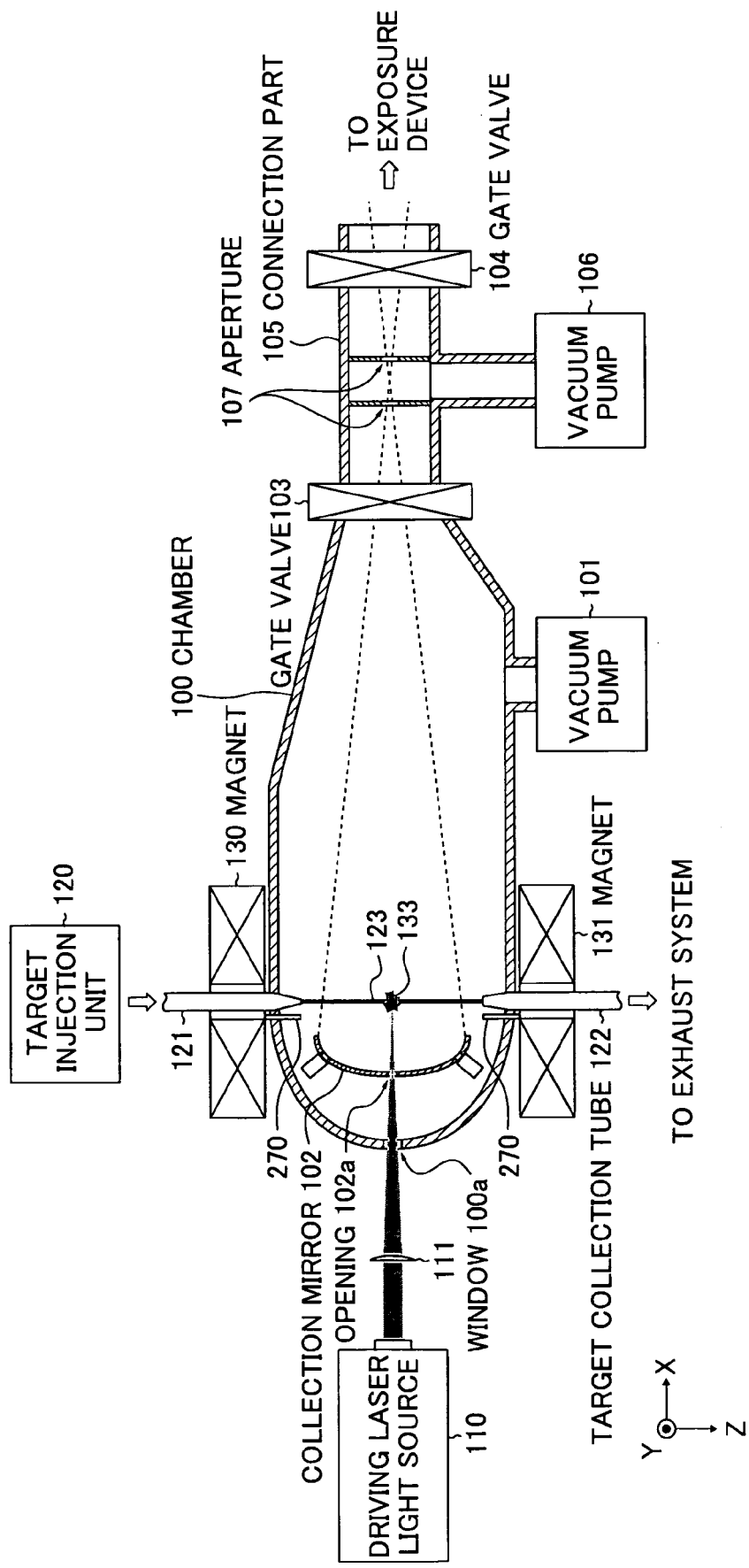
FIG. 22 is a schematic diagram showing a modified example of the EUV light source device shown in FIG. 21.

FIG. 22 is a schematic diagram showing a modified example of the EUV light source device shown in FIG. 21. In the modified example, a gas shield device 270 is provided near the target injection nozzle 121 and the target collection tube 122, and the gas for shielding flows along the orbit of the target material 123. Thereby, debris generated from the EUV light generation plasma can be prevented from flying toward the collection mirror 102 side.

In the embodiment, the configuration in which the gas shield device is added to the damage prevention mechanism of the collection mirror using X-ray tubes has been described, however, as explained in the second to ninth embodiments, the gas shield device can be similarly added to the other collection mirror damage prevention mechanisms using X-ray tubes or collection mirror damage prevention mechanisms using an electron gun, plasma, or reflection mirror.

In the above-mentioned first to tenth embodiments of the present invention, debris has been trapped by forming a magnetic field within the chamber, however, the arrangement of magnets and the formation of magnetic field formed thereby are not limited to those described in the embodiments. For example, a baseball magnetic field may be formed by providing an electromagnetic coil so as to wrap around the collection mirror. Further, in the case of using an electromagnet, a steady magnetic field may be generated by steadily supplying current to the coil, or a pulse magnetic field may be generated in synchronization with the operation of the driving laser light source.

The present invention can be utilized in a light source device that generates EUV light by applying a laser beam to a target. Furthermore, the present invention can be utilized in exposure equipment using such a light source device.

The invention claimed is:

1. An extreme ultra violet light source device for generating extreme ultra violet light by irradiating a laser beam to a target, said device comprising:

a chamber in which extreme ultra violet light is to be generated;

a target supplier for supplying said chamber with a material to become said target;

a laser light source for irradiating a laser beam to said target so as to generate plasma;

a collection optical system for collecting extreme ultra violet light emitted from the plasma;

a magnetic field generator for generating a magnetic field within said chamber so as to trap charged particles included in particles emitted from the plasma; and an ionizer for ionizing neutral particles included in the particles emitted from the plasma into charged particles so as to cause the magnetic field to trap the charged particles ionized by said ionizer.

2. The extreme ultra violet light source device according to claim 1, further comprising:

a collector for collecting at least the charged particles trapped by the magnetic field and for ejecting the charged particles to an outside of said chamber.

3. The extreme ultra violet light source device according to claim 1, wherein said ionizer includes an X-ray applied for applying an X-ray toward the neutral particles.

4. The extreme ultra violet light source device according to claim 1, wherein said ionizer includes an electron gun for emitting an electron toward the neutral particles.

5. The extreme ultra violet light source device according to claim 1, wherein said ionizer includes a plasma generator for generating second plasma to collide with the neutral particles.

6. The extreme ultra violet light source device according to claim 5, wherein said plasma generator includes a microwave waveguide.

7. The extreme ultra violet light source device according to claim 5, wherein said plasma generator includes a high-frequency power supply and an antenna for helicon wave excitation connected to said high-frequency power supply.

8. The extreme ultra violet light source device according to claim 5, wherein said plasma generator includes a high-frequency power supply and an antenna connected to said high-frequency power supply so as to generate inductively coupled plasma.

9. The extreme ultra violet light source device according to claim 5, wherein said plasma generator includes a gyrotron for generating electromagnetic waves to be entered into said chamber.

10. The extreme ultra violet light source device according to claim 1, wherein said ionizer includes a reflection mirror for reflecting a wavelength component, which can ionize the neutral particles emitted from the plasma among plural wavelength components contained in the extreme ultra violet light emitted from the plasma, toward the plasma.

11. The extreme ultra violet light source device according to claim 10, wherein said reflection mirror is configured to reflect a wavelength component having a wavelength not larger than 90 nm, and wherein said target is xenon.

12. The extreme ultra violet light source device according to claim 1, further comprising:

a shielding gas introducer for introducing a gas for shielding at least between the plasma and said collection optical system.

* * * * *